United States Patent [19]
Sakaguchi et al.

[11] Patent Number: 5,868,947
[45] Date of Patent: Feb. 9, 1999

[54] SI SUBSTRATE AND METHOD OF PROCESSING THE SAME

[75] Inventors: Kiyofumi Sakaguchi; Takao Yonehara, both of Atsugi, Japan

[73] Assignee: Canon Kabushiki Kaisha, Tokyo, Japan

[21] Appl. No.: 582,221

[22] Filed: Jan. 3, 1996

Related U.S. Application Data

[63] Continuation of Ser. No. 383,689, Feb. 1, 1995, abandoned, which is a continuation of Ser. No. 949,563, Sep. 23, 1992, abandoned.

[30] Foreign Application Priority Data

| | | | |
|---|---|---|---|
| Sep. 20, 1991 | [JP] | Japan | 3-275052 |
| Sep. 27, 1991 | [JP] | Japan | 3-275053 |
| Sep. 27, 1991 | [JP] | Japan | 3-275054 |
| Sep. 30, 1991 | [JP] | Japan | 3-276374 |
| Sep. 30, 1991 | [JP] | Japan | 3-276375 |
| Sep. 30, 1991 | [JP] | Japan | 3-276376 |

[51] Int. Cl.⁶ ............................................ B05D 5/00
[52] U.S. Cl. ............................ 216/2; 216/12; 216/41; 216/56; 216/87; 216/99; 216/109
[58] Field of Search ......................... 216/2, 12, 41, 216/56, 87, 99, 109

[56] References Cited

U.S. PATENT DOCUMENTS

| | | | |
|---|---|---|---|
| 3,756,877 | 9/1973 | Muraoka et al. | 156/17 |
| 3,962,052 | 6/1976 | Abbas et al. | 204/129.3 |
| 4,096,619 | 6/1978 | Cook, Jr. | 204/129.65 X |
| 4,171,242 | 10/1979 | Liu | 156/657 |
| 4,198,263 | 4/1980 | Matsuda | 156/639 |
| 4,966,663 | 10/1990 | Mauger | 204/129.65 X |
| 5,201,987 | 4/1993 | Hawkins et al. | 156/644 X |

FOREIGN PATENT DOCUMENTS

| | | |
|---|---|---|
| 0499488 | 8/1992 | European Pat. Off. . |
| WO9109420 | 6/1991 | WIPO . |

OTHER PUBLICATIONS

Uülir, *Electrolytic Shaping of Germanium and Silicon*, The Bell System Technical Journal, vol. 35 (1956), pp. 333–347.
Unagami, *Form. Mech. of Porous Si Layer by Anodiz. in HF Sol.*, Jour. of the Electrochemical Soc., vol. 127, No. 2 (1980), pp. 476–483.
Bomchil, et al., *Pore Size Distr. in Porous Si Studied by Adsorp. Iso.*, Jour. of the Electrochemical Soc., vol. 130, No. 7 (1983), pp. 1611–1614.
Holmstrom, et al., Applied Physics Letters, vol. 42, No. 4 (Feb. 15, 1983), pp. 386–388.
Canham, Applied Physics Letters, vol. 57, No. 10 (Sep. 3, 1990) pp. 1046–1048.
Benjamin, et al., Applied Physics Letters, vol. 49, No. 12 (Sep. 22, 1986) pp. 716–718.
Schwuttke, et al., IBM Technical Disclosure Bulletin, vol. 14, No. 11 (Apr. 1972), p. 3405.

*Primary Examiner*—Thi Dang
*Attorney, Agent, or Firm*—Fitzpatrick, Cella, Harper & Scinto

[57] ABSTRACT

A processed Si product suitable for use as, for example, an X-ray mask, is produced by a process having the steps of preparing a non-porous Si substrate, changing by anodization at least a portion of the substrate into porous Si thereby forming at least one porous Si region penetrating the substrate from one to the other side thereof, and effecting an etching on the substrate by using an etchant containing hydrofluoric acid so as to remove the porous Si region. The substrate may be provided with an etching stop layer. In such a case, an unsupported membrane region formed by the etching stop layer is left after the removal of the porous Si region.

4 Claims, 21 Drawing Sheets

SI SUBSTRATE AND METHOD OF PROCESSING THE SAME

This application is a continuation of application Ser. No. 08/383,689 filed Feb. 1, 1995, now abandoned, which is a continuation of application Ser. No. 07/949,563 filed Sep. 23, 1992 now abandoned.

BACKGROUND OF THE INVENTION

1. Field of the Invention

The present invention relates to an Si product, typically an Si substrate, used in the production of various devices such as a semiconductor device, an X-ray mask and a micro-mechanism, as well as for use as a light-transmitting substrate, and also to a method of processing such an Si product. More particularly, the present invention is concerned with an Si product or substrate which is obtained by forming at least one porous Si region in an Si body and then removing such porous Si region, as well as to a processing method for processing such an Si product.

2. Related Background Art

Studies have been made in recent years as to, for example, micro-mechanisms which are produced by processing a bulk Si by various etching methods such as chemical etching, RIE (reactive ion etching) and electrolytic grinding.

Chemical etching is a method in which an Si substrate is partly covered by a mask of a resist, $Si_3N_4$ or $SiO_2$ and is immersed in an etchant so that the Si substrate is selectively etched at portions which are lot covered by the mask.

RIE (reactive ion etching) is a method in which an Si substrate is partly covered by a mask of a resist, $Si_3N_4$ or $SiO_2$ and is subjected to a reactive ion atmosphere so that the Si substrate is selectively etched at portions which are not covered by the mask.

Electrolytic grinding is a method in which an electrolysis is conducted in an HF solution or a KOH solution by employing Si as an electrode, so as to grind the Si electrode. In a method known as anodic etching which is a kind of the electrolytic polishing, an electrolysis is conducted in a thin HF solution using Si and platinum or gold as an anode and a cathode, respectively, so that the Si is etched as a result of the electrolytic reaction taking place on the above.

Porous Si was discovered by Uhlir et al. in 1956 in the course of study of electrolytic grinding of semiconductors (A. Uhlir, Bell Sys. Tech. J. vol. 35,333 (1956)).

Unagami et al. have studied Si dissolving reaction of Si in anodization and found that holes are essentially required in anodic reaction of Si in HF solution. Unagami et al. also report that the dissolving reaction is as follows (T. Unagami, J. Electrochem. Soc., vol. 127, 476 (1980)):

$$Si+2HF+(2-n)e+ \rightarrow SiF_2+2H^+ +ne^- \quad (1)$$

$$SiF_2+2HF \rightarrow SiF_4+H_2 \quad (2)$$

$$SiF_4+2HF \rightarrow H_2SiF_6 \quad (3)$$

or, alternatively, $$Si+4HF+(4-\lambda)e^+ \rightarrow SiF_4+4H^+ +\lambda e^- \quad (4)$$

$$SiF_4+2HF \rightarrow H_2SiF_6 \quad (5)$$

wherein $e^+$ and $e^-$ respectively represent a hole and an electron, n and $\lambda$ respectively represent the number of holes necessary for dissolving one Si atom. It is reported that a porous Si is formed on condition of n>2 or $\lambda$>4.

Thus, production of porous Si essentially requires holes. This means that N-type Si is easier to change into porous Si than P-type Si is. It is known, however, N-type Si can also be changed into porous Si by injection of holes (R. P. Holmstrom and J. Y. Chi, Appln. Phys. Lett., vol. 42,386 (1983)).

While single crystal Si generally has a density of 2.33 g/cm³, the density of porous Si can be varied within the range of 1.1 to 0.6 g/cm³ when the density of HF solution is varied between 50 and 20%.

A transmission-electroscopic observation shows that a porous Si layer has micro-pores of about 600 Å in mean diameter, and that single crystallinity is still maintained despite that the density is reduced to less than half than that of the single crystal Si. It is therefore possible to form a single crystal Si layer on the porous layer by epitaxial growth.

In general, oxidation of a single crystal Si causes an expansion of the Si to a size which is about 2.2 times as large than that of the original single crystal Si. It is possible to restrain the expansion by controlling the density of the porous Si, which makes it possible to prevent warping of an Si substrate, as well as cracking which may be introduced into the remaining single crystal surface layer.

Representing the density of the porous Si by A, the volumetric ratio R between the volume of the single crystal Si after oxidation to the volume of the porous Si is represented by the following formula:

$$R=2.2\times(A/2.33) \quad (6)$$

When no expansion is caused by oxidation, i.e., when R=1 is met, the density A of the porous Si is 1.06 (g/cm³). This means that expansion of the single crystal Si is suppressed by selecting the density of the porous Si to be 1.06.

In general, a porous layer has a large void so that its density is as small as half or below that of the non-porous structure. The porous structure, therefore, has a surface area which is much greater than that of the non-porous structure. For this reason, a porous layer exhibits a much greater etching rate than an ordinary single crystal layer.

A description will now be given of an operation for etching a porous Si.

In the current technique, in almost all cases, porous Si products as produced are directly subjected to a subsequent step, e.g., an epitaxial growth process. In other words, no processing is effected on the porous Si, due to difficulty encountered in processing or removing porous Si with high degrees of controllability. As a matter of fact, no report has been made which would show that etching of porous Si can be done with good controllability.

In general, it is possible to obtain an oxidized porous Si equivalent in quality to single crystal Si oxide film by adjusting condition of anodization such that the porosity P, which is expressed by the following formula (7), falls within the range of between 30 and 55%:

$$P=(2.33-A)/2.33 \quad (7)$$

The porosity P also can be expressed as follows:

$$P=(m1-m2)/(m1-m3) \quad (8)$$

or $$P=(m1-m2)/\rho At \quad (9)$$

m1: overall weight before anodization
m2: overall weight after anodization m3: overall weight after removal of porous Si ρ: density of single crystal Si A: area changed into porous state t: thickness of porous Si In some cases, it is not possible to exactly calculate the area changed into porous Si. In such cases, the formula (8) is advantageously employed but the formula (8) essentially requires etching of the porous Si for the purpose of measurement of the value of m3.

When an epitaxial growth is effected on a porous Si, any stress which is generated during hetero-epitaxial growth can conveniently be absorbed by the specific structure of porous Si, thus suppressing generation of defects. Obviously, the porosity of the porous Si is an important factor for achieving such a stress relieving effect. Measurement of porosity is therefore essential in order to successfully carry out epitaxial growth on porous Si.

Two types of etching methods are known as methods of etching porous Si.

The first method employs an aqueous solution of NaOH as the etchant (G. Bonchil, R. Herino, K. Barla, and J. C. Pfister, J. Electrochem. Soc., vol. 130, no. 71611 (1983)) while the second method employs, a solution which is capable of etching non-porous Si as the etchant.

The etchant used in the second method is typically a fluoro-nitric acid type etchant. When such an etchant is used, the etching process can be represented as follows:

$$Si + 2O \rightarrow SiO_2 \quad (10)$$

$$SiO_2 + 4HF \rightarrow SiF_4 + H_2O \quad (11)$$

Thus, Si is oxidized by nitric acid into $SiO_2$ which is then etched by hydrofluoric acid, whereby Si is etched.

Various other etchants can be used for etching non-porous Si, such as etchants of ethylene diamine type, KOH type and hydrazine type, besides fluoro-nitric acid type etchant mentioned before.

Thus, selective etching for removing porous Si essentially requires that the etchant employed can etch porous Si but not non-porous Si.

These known methods, however, involve the following problems to be solved.

For instance, the bulk etching process essentially requires a mask because there is no difference in the material between the area to be etched and the area which is not to be etched.

Chemical etching often allows a lateral over-etching. In addition, a surface of low-etching rate appears in an anisotropic etching. It is therefore impossible to form an etched region, e.g., a hole, purely by walls perpendicular to the material plane. Furthermore, the form of the etched region varies according to the plane azimuth of the Si substrate.

The RIE (reactive ion etching) can effect etching in the direction perpendicular to the material surface but is almost unable to perforate an Si layer which is as thick as several hundreds of microns to several millimeters.

In electrolytic grinding method which employs an electrical current, it is not allowed to provide the surfaces of the Si substrate with an insulation layer or a semiconductor layer other than the mask.

The etching method which uses a fluoro-nitric acid etchant undesirably allows non-porous Si to be etched, as well as porous Si which is intended to be etched.

Finally, the known method for selectively etching a porous Si by means of aqueous solution of NaOH inevitably suffers from adsorption of Na ions on the etched surface. Deposition of Na ions is a major cause of contamination with impurities and produces undesirable effects such as formation of an interface level and, therefore, must strictly be avoided.

SUMMARY OF THE INVENTION

Accordingly, an object of the present invention is to provide a method which can efficiently, uniformly and selectively etch only porous Si, without etching non-porous Si at all, by employing a wet chemical etchant which does not produce any undesirable effects on the semiconductor production process.

Another object of the present invention is to provide an Si product which is obtained by effecting a selective, easy and uniform etching on a bulk Si and which can suitably be employed in the production of X-ray masks, light-transmitting substrates and micro-machining, as well as a method of processing such an Si product.

To these ends, according to one aspect of the present invention, there is provided a processed Si product produced by a process comprising the steps of preparing a non-porous Si substrate, changing at least a portion of the substrate into porous Si thereby forming at least one porous Si region penetrating the substrate from one to the other side thereof, and effecting an etching on the substrate by using an etchant containing hydrofluoric acid so as to remove the porous Si region.

According to another aspect of the present invention, there is provided a processed Si product produced by a process comprising the steps of preparing a non-porous Si substrate which is provided on one side thereof with an etching stop layer, changing at least a portion of the substrate into porous Si thereby forming at least one porous Si region penetrating the substrate to reach the etching stop layer from the side of the substrate opposite to said etching stop layer, and effecting an etching on the substrate by using an etchant containing hydrofluoric acid so as to remove the porous Si region thereby forming a cavity, whereby the etching stop layer remains contacting the cavity.

According to still another aspect of the present invention, there is provided a method of processing an Si substrate comprising the steps of: preparing a non-porous Si substrate; changing at least a portion of the substrate into porous Si thereby forming at least one porous Si region penetrating the substrate from one to the other side thereof; and effecting an etching on the substrate by using an etchant containing hydrofluoric acid so as to remove the porous Si region.

According to a further aspect of the present invention, there is provided a method of processing an Si substrate comprising the steps of: preparing a non-porous Si substrate having an etching stop layer formed on one side thereof and at least one porous Si region penetrating the substrate to reach the etching stop layer from the side of the substrate opposite to the etching stop layer; and effecting an etching on the substrate so as to remove only the porous Si region, thereby forming a cavity; whereby the etching stop layer remains contacting the cavity.

According to the present invention, it is possible to chemically etch at least one porous Si region formed in a non-porous Si substrate, with high degrees of precision and uniformity, by employing a wet chemical etchant containing hydrofluoric acid which can be used in ordinary semiconductor production processes and which does not etch non-porous Si. It is also possible to perforate perforate by etching a non-porous Si from one side to the other side thereon in desired shape and size. When an etching stop layer is provided on the above-mentioned other side of the non-porous Si, the etching stop layer can form an unsupported membrane.

By adding alcohol to the etchant, it is possible to remove voids of etching reaction product gases from the etched surface instantaneously and without requiring agitation, so that a porous Si can be etched uniformly and efficiently with a high degree of smoothness.

It is also possible to accelerate oxidation of silicon by using an etchant containing an aqueous solution of hydrogen peroxide. Consequently, the reaction rate can be increased as compared with the case where the etchant does not contain aqueous solution of hydrogen peroxide. By varying the content of aqueous solution of hydrogen peroxide, it is possible to control the reaction speed.

The porous Si used in the invention is formed along the flow of electrical current during anodization. It is therefore possible to process a non-porous Si in any desired shape substantially in a required shape, by controlling the flow of the electrical current by providing a mask or an intentional impurity distribution.

According to the present invention, it is possible to form at least one hole in a non-porous Si substrate in such a manner that the hole extend from one surface of the substrate to reach an etching stop film provided on the other side of the substrate. At least one such hole can be formed by a process having the steps of transforming at least one portion of the non-porous Si substrate into porous Si, attaching the etching stop film on the above-mentioned other side of the substrate, and efficiently and accurately removing the porous Si by the etchant specified by the present invention.

Furthermore, the present invention makes it possible to produce an Si substrate which is usable as an X-ray mask, a light-transmitting substrate or a substrate of a micro-machining.

When an etching stop film is used, it is possible to form one or more layers on such an etching stop film. In such a case, the unsupported layer can have a laminate structure having a greater strength than that obtained when the etching stop layer is used alone. It is therefore possible to form an unsupported layer having no slack or cracking, despite any stress which may be produce difference in thermal expansion between the substrate and the material of the thin layer.

The etchant suitably used in the present invention is a solution which contains hydrofluoric acid. The hydrofluoric acid may be contained alone or in the form of a mixture liquid formed by adding at least one of an alcohol and an aqueous solution of hydrogen peroxide, a buffered hydrofluoric acid, or a mixture liquid formed by adding at least one of an alcohol and aqueous solution of hydrogen peroxide to buffered hydrofluoric acid.

The above-mentioned etchant has an extremely small degree of contamination and, hence, does not adversely affect the semiconductor production process. With this etchant, it is possible to efficiently and uniformly etch porous Si, thus selectively removing porous Si, without etching non-porous Si.

The etching solution, particularly when it contains an alcohol, can instantaneously remove voids of etching reaction product gases from the etched surface without requiring agitation of the etchant, so that porous Si can be etched and removed with high degrees of uniformity and efficiency.

Furthermore, the etchant, particularly when it contains aqueous solution of hydrogen peroxide, accelerates oxidation of Si so as to promote the etching reaction as compared with the case where aqueous solution of hydrogen peroxide is not contained. Furthermore, by varying the ratio of aqueous solution of hydrogen peroxide, it is possible to control the reaction rate.

The above and other objects, features and advantages of the present invention will become clear from the following description of the preferred embodiments when the same is read in conjunction with the accompanying drawings.

DESCRIPTION OF THE PREFERRED EMBODIMENTS

Embodiments of the present invention will be described hereinunder.

Embodiment 1

FIGS. 13 to 20 show etching characteristics of various etchants on porous Si and non-porous Si.

Figure 13:
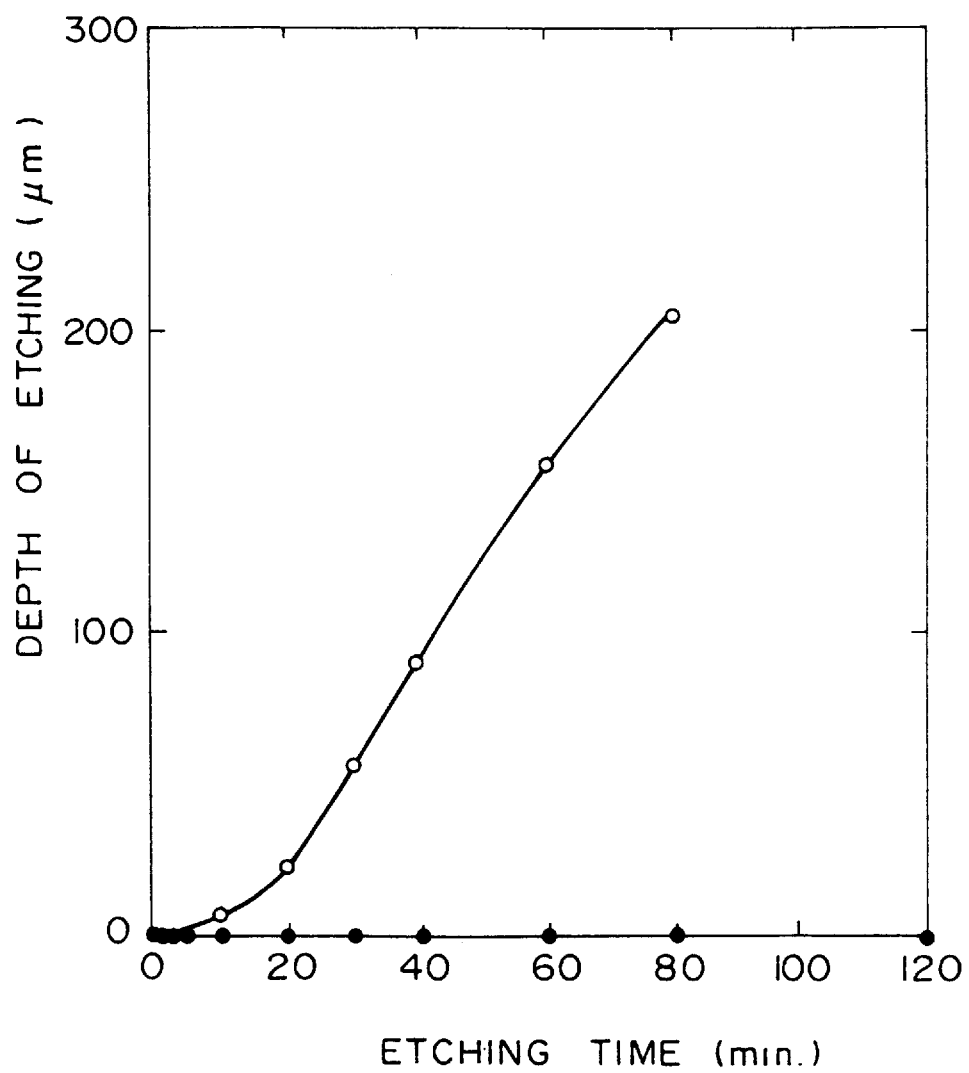
FIG. 13 is a graph illustrating the etching characteristic of an etchant used in the present invention.

More specifically, FIG. 13 shows etching characteristics as observed when hydrofluoric acid is used as the etchant.

Figure 14:
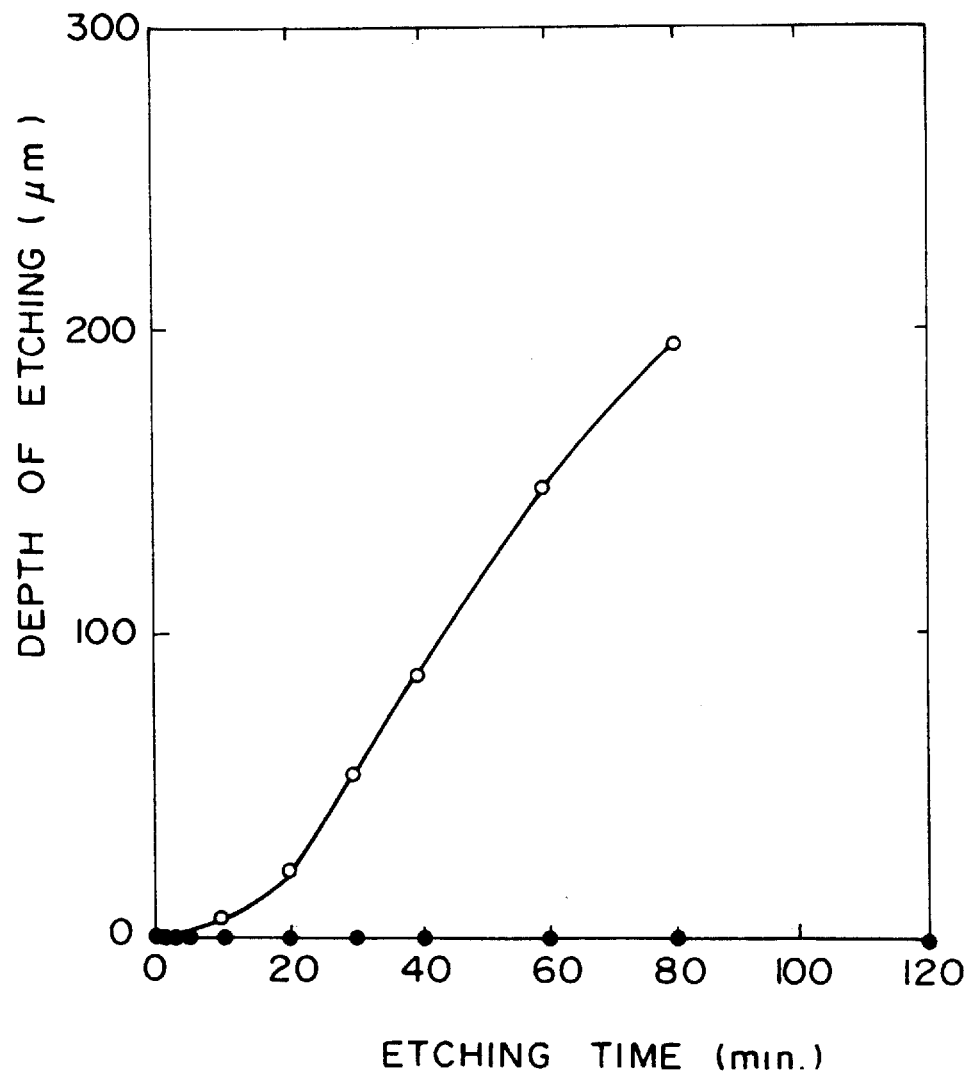
FIG. 14 is a graph illustrating the etching characteristic of another etchant used in the present invention.

FIG. 14 shows characteristics as observed when a mixture of hydrofluoric acid and an alcohol is used as the etchant.

Figure 15:
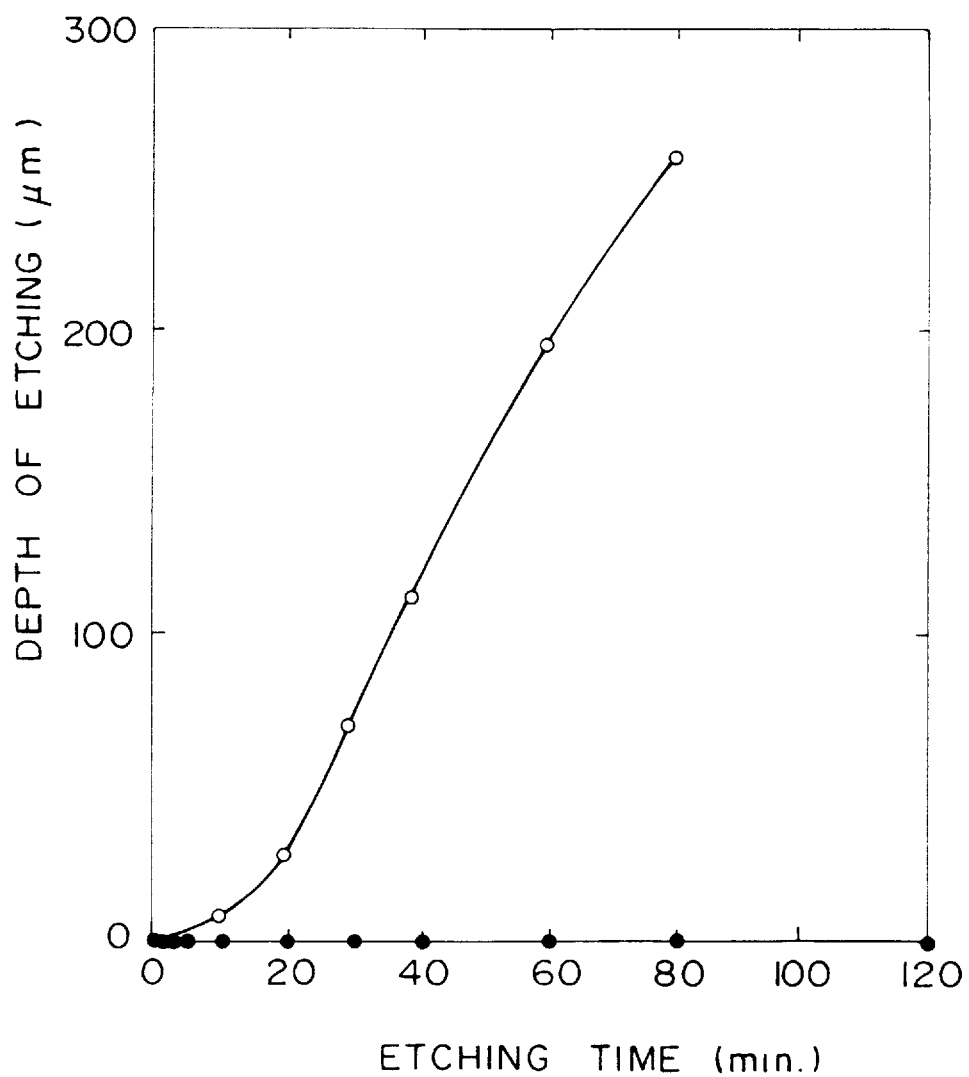
FIG. 15 is a graph illustrating the etching characteristic of still another etchant used in the present invention.

FIG. 15 shows characteristics as observed when a mixture of hydrofluoric acid and an aqueous solution of hydrogen peroxide is used as the etchant.

Figure 16:
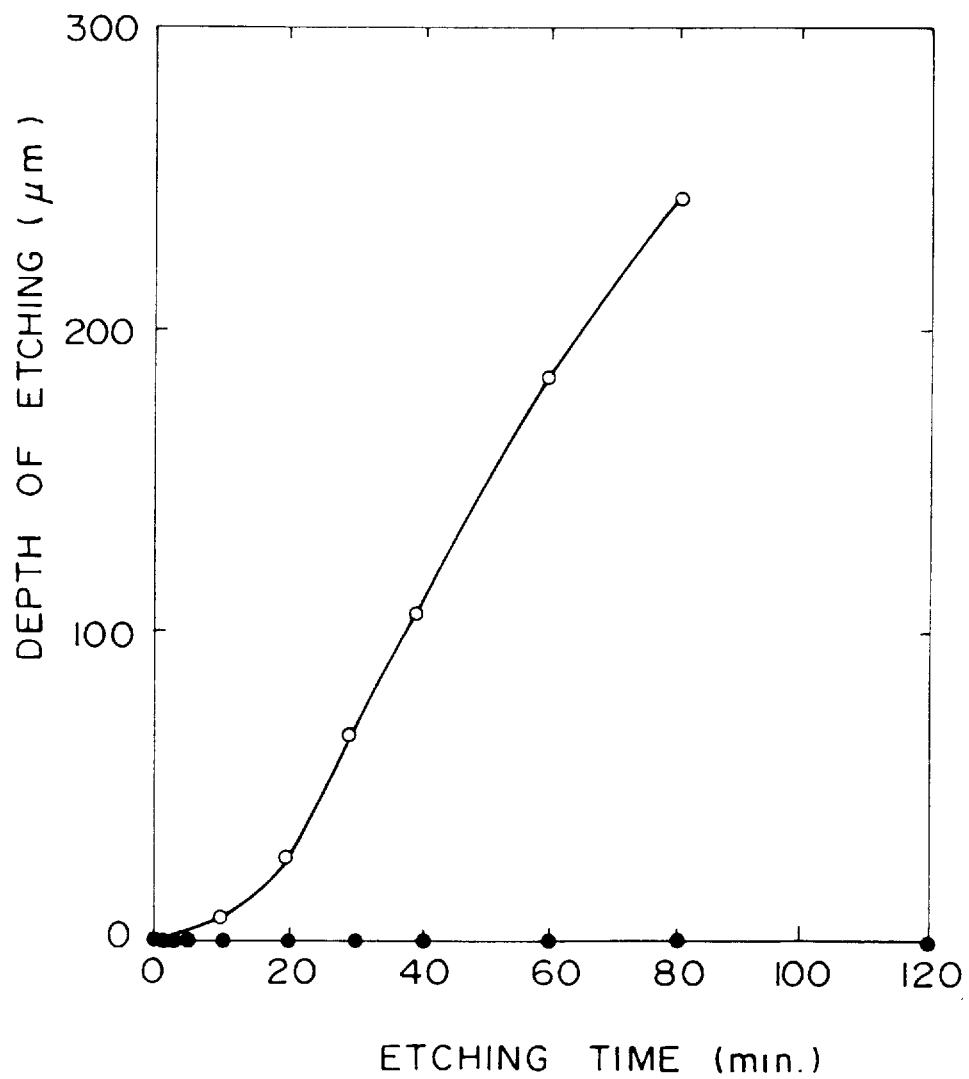
FIG. 16 is a graph illustrating the etching characteristic of a further etchant used in the present invention.

FIG. 16 shows characteristics as observed when a mixture of hydrofluoric acid, an alcohol and an aqueous solution of hydrogen peroxide is used as the etchant.

Figure 17:
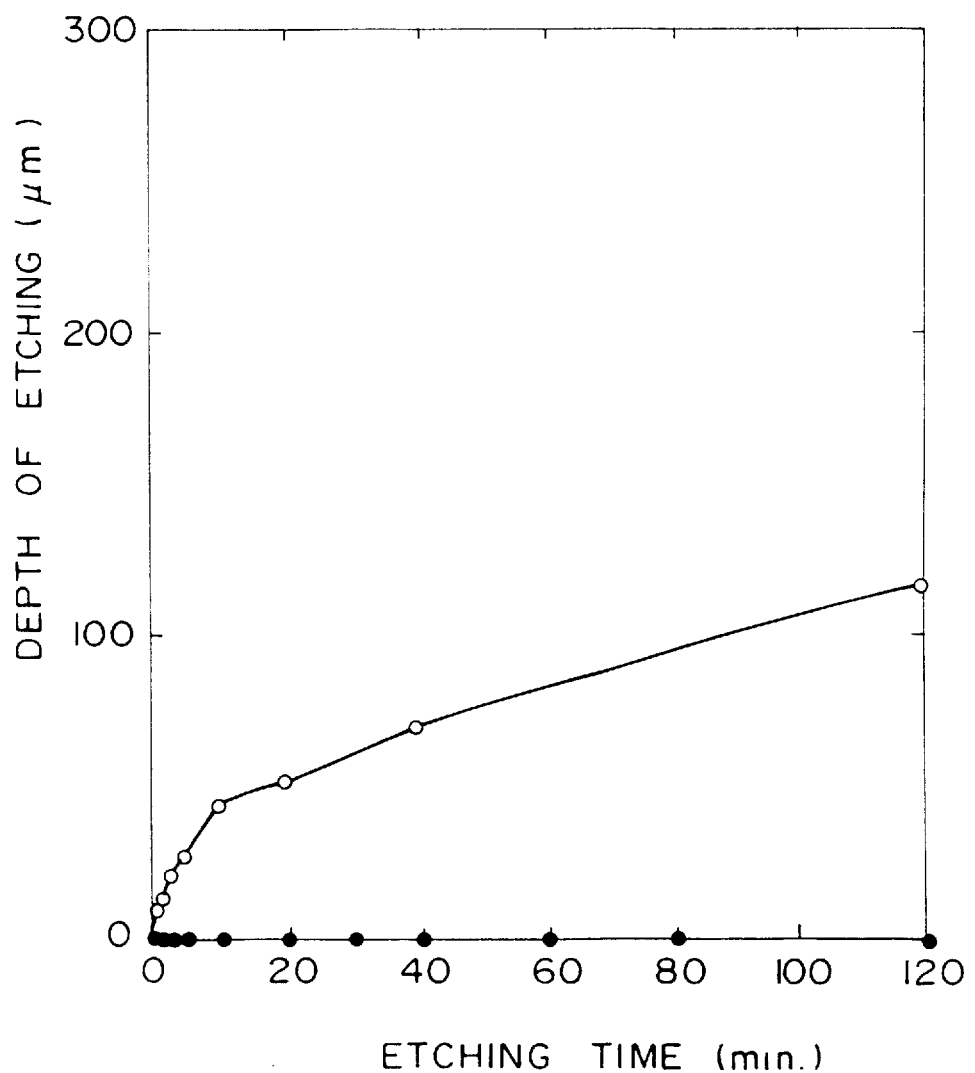
FIG. 17 is a graph illustrating the etching characteristic of a different etchant used in the present invention.

FIG. 17 shows characteristics as observed when a buffered hydrofluoric acid is used as the etchant.

Figure 18:
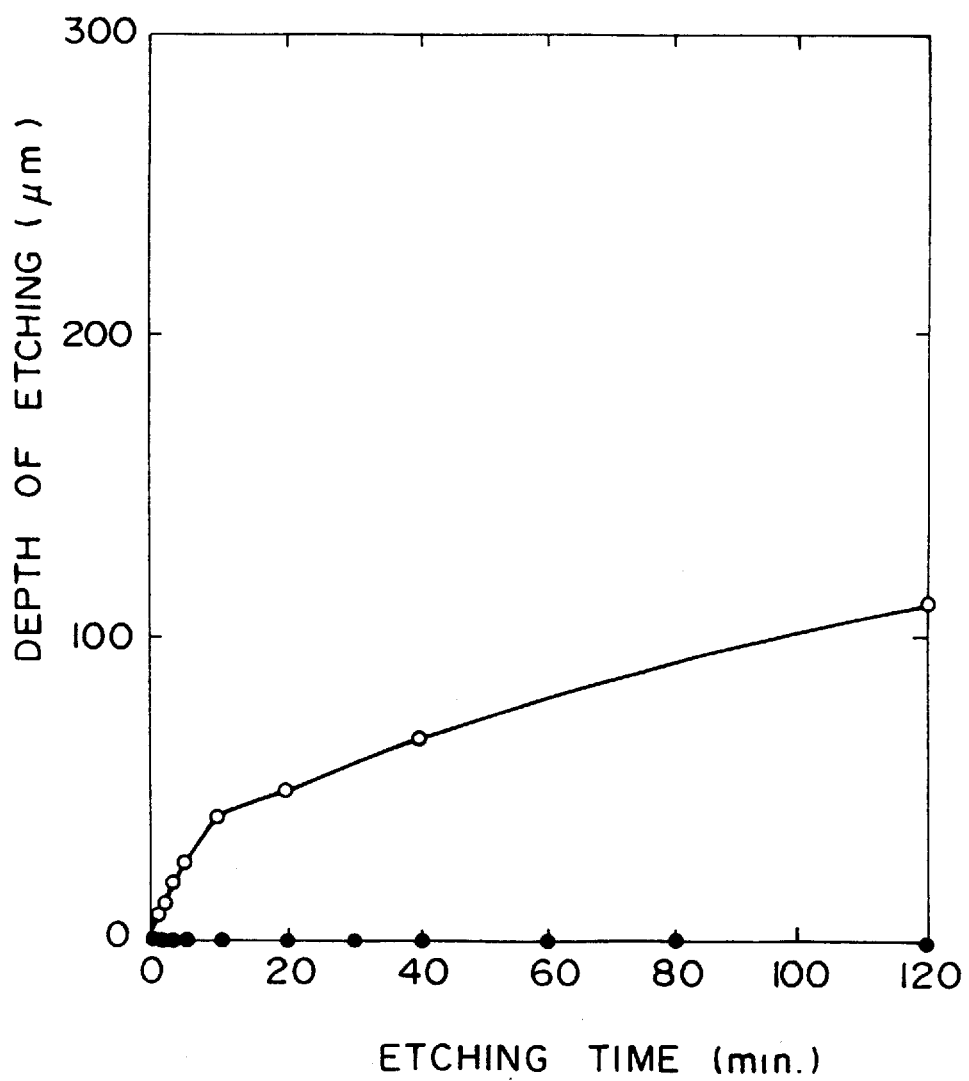
FIG. 18 is a graph illustrating the etching characteristic of a different etchant used in the present invention.

FIG. 18 shows characteristics as observed when a mixture of buffered hydrofluoric acid and an alcohol is used as the etchant.

Figure 19:
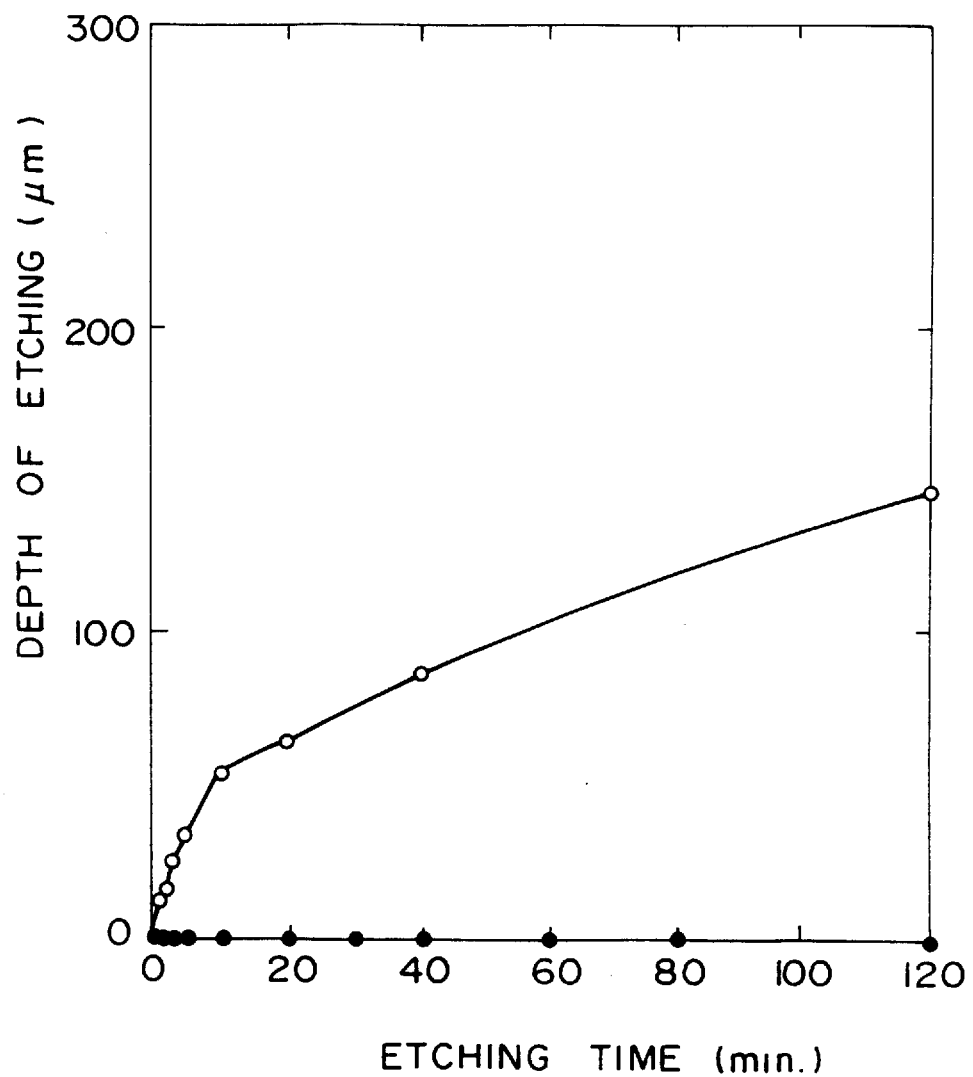
FIG. 19 is a graph illustrating the etching characteristic of a different etchant used in the present invention.

FIG. 19 shows characteristics as observed when a mixture of buffered hydrofluoric acid and an aqueous solution of hydrogen peroxide is used as the etchant.

Figure 20:
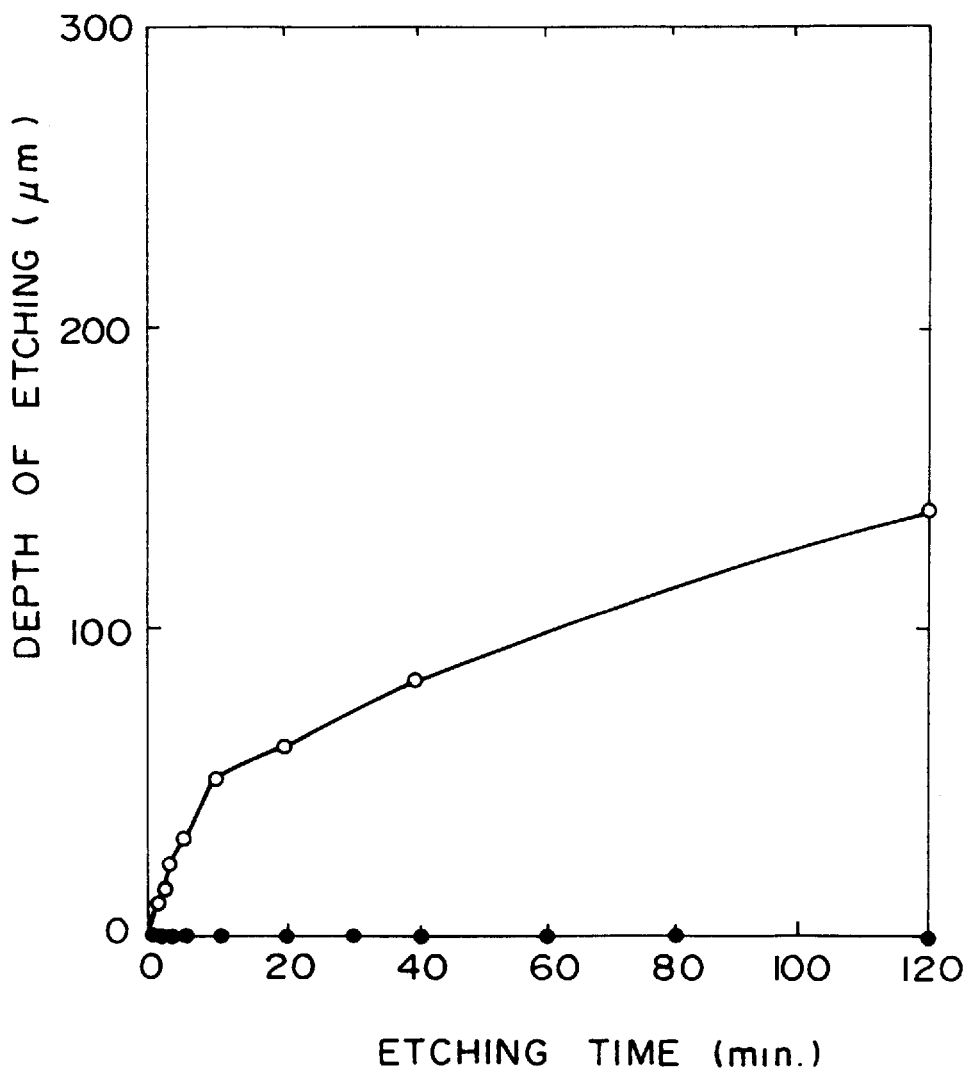
FIG. 20 is a graph illustrating the etching characteristic of a different etchant used in the present invention.

FIG. 20 shows characteristics as observed when a mixture of buffered hydrofluoric acid, an alcohol and an aqueous solution of hydrogen peroxide is used as the etchant.

The porous Si is formed by anodization of a single crystal Si under the following conditions. The starting material, however, is not limited to the single crystal Si. Namely, it is possible to employ Si of other types of crystalline structures.

Voltage applied: 2.6 (V)

Current density: 30 (mA·cm$^{-2}$)

Anodizing solution: HF: H$_2$O: C$_2$H$_5$OH=1:1:1

Anodizing time: 2.4 hours

Thickness of porous Si: 300 ($\mu$m)

Porosity: 56 (%)

FIG. 13 shows time-dependency of etching depth on the porous Si and a single crystal Si as a non-porous Si, as measured by immersing these silicons in an agitated solution of hydrofluoric acid and measuring the thicknesses of these silicons time by time.

More specifically, the porous Si prepared by anodization was immersed at room temperature in a 49% hydrofluoric acid solution while the solution was agitated, and the reduction in the thickness of the porous Si was measured time by time. The thickness of the porous Si was plotted in relation to time as indicated by white circles in FIG. 13. It will be seen that the porous Si was rapidly etched to a depth of 90 $\mu$m in about 40 minutes and further to a depth of 205 $\mu$m in 80 minutes, with a high degree of uniformity and quality of the etched surface. It was confirmed that the etching rate depends on the thickness of the solution and the temperature of the same.

On the other hand, the single crystal Si as non-porous Si was prepared in the form of a bulk of 500 $\mu$m thick and was immersed at room temperature in a 49% hydrofluoric acid solution while the solution was agitated, and the reduction in the thickness of the single crystal Si was measured time by time. As indicated by black circles in FIG. 13, the single crystal Si was not substantially etched. Namely, the depth of etching was as small as 60 Å or less, even after elapse of 80 minutes from the start of the immersion.

FIG. 14 shows time-dependency of etching depth on the porous Si and a single crystal Si as a non-porous Si, as measured by immersing these silicons in a mixture of hydrofluoric acid and an alcohol without agitation and measuring the thicknesses of these silicons time by time.

More specifically, the porous Si prepared by anodization was immersed at room temperature in a mixture of 49% hydrofluoric acid solution and an alcohol (10:1) without agitation, and the reduction in the thickness of the porous Si was measured time by time. The thickness of the porous Si was plotted in relation to time as indicated by white circles in FIG. 14. It will be seen that the porous Si was rapidly etched to a depth of 85 $\mu$m in about 40 minutes and further to a depth of 195 $\mu$m in 80 minutes, with a high degree of uniformity and quality of the etched surface. It was confirmed that the etching rate depends on the thickness of the solution and the temperature of the same.

It is understood that, by virtue of addition of alcohol, voids of etching reaction product gases were instantaneously removed from the etched surface without requiring agitation of the etchant, so that the porous Si could be uniformly and efficiently etched.

On the other hand, the single crystal Si as non-porous Si was prepared in the form of a bulk of 500 $\mu$m thick and was immersed at room temperature in a mixture of 49% hydrofluoric acid solution and an alcohol (10:1) without agitation, and the reduction in the thickness of the porous Si was measured time by time. As indicated by black circles in FIG. 14, the single crystal Si was not substantially etched. Namely, the depth of etching was as small as 60 Å or less, even after elapse of 80 minutes from the start of the immersion.

FIG. 15 shows time-dependency of etching depth on the porous Si and a single crystal Si as a non-porous Si, as measured by immersing these silicons in an agitated mixture of hydrofluoric acid and an aqueous solution of hydrogen peroxide and measuring the thicknesses of these silicons time by time.

More specifically, the porous Si prepared by anodization was immersed at room temperature in an agitated mixture of 49% hydrofluoric acid solution and a 30% aqueous solution of hydrogen peroxide (1:5), and the reduction in the thickness of the porous Si was measured time by time. The thickness of the porous Si was plotted in relation to time as indicated by white circles in FIG. 15. It will be seen that the porous Si was rapidly etched to a depth of 112 $\mu$m in about 40 minutes and further to a depth of 256 $\mu$m in 80 minutes, with a high degree of uniformity and quality of the etched surface. It was confirmed that the etching rate depends on the thickness of the solution and the temperature of the same.

It is understood that, by virtue of addition of the aqueous solution of hydrogen peroxide, the oxidation of Si was accelerated so as to realize a greater reaction speed than the case where hydrogen peroxide is not added. It is therefore understood that the reaction speed is controllable by varying the content of the aqueous solution of hydrogen peroxide.

On the other hand, the single crystal Si as non-porous Si was prepared in the form of a bulk of 500 $\mu$m thick and was immersed at room temperature in an agitated mixture of 49% hydrofluoric acid solution and a 30% aqueous solution of hydrogen peroxide (1:5), and the reduction in the thickness of the porous Si was measured time by time. As indicated by black circles in FIG. 15, the depth of etching was as small as 60 Å or less, even after elapse of 80 minutes from the start of the immersion.

FIG. 16 shows time-dependency of etching depth on the porous Si and a single crystal Si as a non-porous Si, as measured by immersing these silicons in a mixture of hydrofluoric acid, an alcohol and an aqueous solution of hydrogen peroxide without agitation and measuring the thicknesses of these silicons time by time.

More specifically, the porous Si prepared by anodization was immersed at room temperature in a mixture of 49% hydrofluoric acid solution, an alcohol and a 30% aqueous solution of hydrogen peroxide (10:6:50) without agitation, and the reduction in the thickness of the porous Si was measured time by time. The thickness of the porous Si was plotted in relation to time as indicated by white circles in FIG. 16. It will be seen that the porous Si was rapidly etched to a depth of 106 $\mu$m in about 40 minutes and further to a depth of 244 $\mu$m in 80 minutes, with a high degree of uniformity and quality of the etched surface. It was confirmed that the etching rate depends on the thickness of the solution and the temperature of the same.

It is understood that, by virtue of addition of alcohol, voids of etching reaction product gas were instantaneously removed from the etched surface without requiring agitation of the etchant, so that the porous Si could be uniformly and efficiently etched.

It is also understood that, by virtue of addition of the aqueous solution of hydrogen peroxide, the oxidation of Si was accelerated so as to realize a greater reaction speed than the case where hydrogen peroxide is not added. It is therefore understood that the reaction speed is controllable by varying the content of the aqueous solution of hydrogen peroxide.

On the other hand, the single crystal Si as non-porous Si was prepared in the form of a bulk of 500 $\mu$m thick and was immersed at room temperature in a mixture of 49% hydrofluoric acid solution, an alcohol and a 30% aqueous solution of hydrogen peroxide (10:6:50) without agitation, and the reduction in the thickness of the porous Si was measured time by time. As indicated by black circles in FIG. 16, the depth of etching was as small as 60 Å or less, even after elapse of 80 minutes from the start of the immersion.

The porous Si and the single crystal Si after the etching conducted with the use of various etchants described above were rinsed with water and the etched surfaces were subjected to a secondary ion trace amount analysis. No impurity was found in each case.

Although the concentration of the aqueous solution of hydrogen peroxide was determined to be 30% in the foregoing etching operations, the concentration of the hydrogen peroxide solution can be freely selected within a range which does not impair the effect of addition of hydrogen peroxide and which does not cause any problem in, for example, preparation process.

FIG. 17 shows time-dependency of etching depth on the porous Si and a single crystal Si as a non-porous Si, as measured by immersing these silicons in an agitated solution of buffered hydrofluoric acid and measuring the thicknesses of these silicons time by time.

More specifically, the porous Si prepared by anodization was immersed at room temperature in a buffered hydrofluoric acid (4.5% HF+36% NH$_4$F+H$_2$O) while the latter was agitated, and the reduction in the thickness of the porous Si was measured time by time. The thickness of the porous Si was plotted in relation to time as indicated by white circles in FIG. 17. It will be seen that the porous Si was rapidly etched to a depth of 70 $\mu$m in about 40 minutes and further to a depth of 118 $\mu$m in 120 minutes, with a high degree of uniformity and quality of the etched surface. It was confirmed that the etching rate depends on the thickness of the solution and the temperature of the same.

On the other hand, the single crystal Si as non-porous Si was prepared in the form of a bulk of 500 $\mu$m thick and was immersed at room temperature in a buffered hydrofluoric acid (4.5% HF+36% NH$_4$F+H$_2$O) while the latter was agitated, and the reduction in the thickness of the single crystal Si was measured time by time. As indicated by black circles in FIG. 17, the single crystal Si was not substantially etched. Namely, the depth of etching was as small as 100 Å or less, even after elapse of 120 minutes from the start of the immersion.

FIG. 18 shows time-dependency of etching depth on the porous Si and a single crystal Si as a non-porous Si, as measured by immersing these silicons in a mixture of a buffered hydrofluoric acid and an alcohol without agitation and measuring the thicknesses of these silicons time by time.

More specifically, the porous Si prepared by anodization was immersed at room temperature in a mixture of buffered hydrofluoric acid (4.5% HF+36% NH$_4$F+H$_2$O) and an alcohol (10:1) without agitation, and the reduction in the thickness of the porous Si was measured time by time. The thickness of the porous Si was plotted in relation to time as indicated by white circles in FIG. 18. It will be seen that the porous Si was rapidly etched to a depth of 67 $\mu$m in about 40 minutes and further to a depth of 112 $\mu$m in 120 minutes, with a high degree of uniformity and quality of the etched surface. It was confirmed that the etching rate depends on the thickness of the solution and the temperature of the same.

It is understood that, by virtue of addition of alcohol, voids of etching reaction product gas were instantaneously removed from the etched surface without requiring agitation of the etchant, so that the porous Si could be uniformly and efficiently etched.

On the other hand, the single crystal Si as non-porous Si was prepared in the form of a bulk of 500 $\mu$m thick and was immersed at room temperature in a mixture of buffered hydrofluoric acid (4.5% HF+36 % NH$_4$F+H$_2$O) and an alcohol (10:1) without agitation, and the reduction in the thickness of the porous Si was measured time by time. As indicated by black circles in FIG. 18, the single crystal Si was not substantially etched. Namely, the depth of etching was as small as 100 Å or less, even after elapse of 120 minutes from the start of the immersion.

FIG. 19 shows time-dependency of etching depth on the porous Si and a single crystal Si as a non-porous Si, as measured by immersing these silicons in an agitated mixture of a buffered hydrofluoric acid and an aqueous solution of hydrogen peroxide and measuring the thicknesses of these silicons time by time.

More specifically, the porous Si prepared by anodization was immersed at room temperature in an agitated mixture of buffered hydrofluoric acid (4.5% HF+36% NH$_4$F+H$_2$O) and a 30% aqueous solution of hydrogen peroxide (1:5), and the reduction in the thickness of the porous Si was measured time by time. The thickness of the porous Si was plotted in relation to time as indicated by white circles in FIG. 19. It will be seen that the porous Si was rapidly etched to a depth of 88 $\mu$m in about 40 minutes and further to a depth of 147 $\mu$m in 200 minutes, with a high degree of uniformity and quality of the etched surface. It was confirmed that the etching rate depends on the thickness of the solution and the temperature of the same.

It is understood that, by virtue of addition of the aqueous solution of hydrogen peroxide, the oxidation of Si was accelerated so as to realize a greater reaction speed than the case where hydrogen peroxide is not added. It is therefore understood that the reaction speed is controllable by varying the content of the aqueous solution of hydrogen peroxide.

On the other hand, the single crystal Si as non-porous Si was prepared in the form of a bulk of 500 $\mu$m thick and was immersed at room temperature in an agitated mixture of buffered hydrofluoric acid (4.5% HF+36% NH$_4$F+H$_2$O) and a 30% aqueous solution of hydrogen peroxide (1:5), and the reduction in the thickness of the porous Si was measured time by time. As indicated by black circles in FIG. 19, the depth of etching was as small as 100 Å or less, even after elapse of 120 minutes from the start of the immersion.

FIG. 20 shows time-dependency of etching depth on the porous Si and a single crystal Si as a non-porous Si, as measured by immersing these silicons in a mixture of a buffered hydrofluoric acid, an alcohol and an aqueous solution of hydrogen peroxide without agitation and measuring the thicknesses of these silicons time by time.

More specifically, the porous Si prepared by anodization was immersed at room temperature in a mixture of a buffered hydrofluoric acid (4.5% HF+36% $NH_4F+H_2O$), an alcohol and a 30% aqueous solution of hydrogen peroxide (10:6:50) without agitation, and the reduction in the thickness of the porous Si was measured time by time. The thickness of the porous Si was plotted in relation to time as indicated by white circles in FIG. 20. It will be seen that the porous Si was rapidly etched to a depth of 83 $\mu$m in about 40 minutes and further to a depth of 140 $\mu$m in 120 minutes, with a high degree of uniformity and quality of the etched surface. It was confirmed that the etching rate depends on the thickness of the solution and the temperature of the same.

It is understood that, by virtue of addition of alcohol, voids of etching reaction product gas were instantaneously removed from the etched surface without requiring agitation of the etchant, so that the porous Si could be uniformly and efficiently etched.

It is also understood that, by virtue of addition of the aqueous solution of hydrogen peroxide, the oxidation of Si was accelerated so as to realize a greater reaction speed than the case where hydrogen peroxide is not added. It is therefore understood that the reaction speed is controllable by varying the content of the aqueous solution of hydrogen peroxide.

On the other hand, the single crystal Si as non-porous Si was prepared in the form of a bulk of 500 $\mu$m thick and was immersed at room temperature in a mixture of buffered hydrofluoric acid (4.5% HF+36% $NH_4F+H_2O$), an alcohol and a 30% aqueous solution of hydrogen peroxide (10:6:50) without agitation, and the reduction in the thickness of the porous Si was measured time by time. As indicated by black circles in FIG. 16, the depth of etching was as small as 100 Å or less, even after elapse of 120 minutes from the start of the immersion.

The porous Si and the single crystal Si after the etching conducted with the use of various etchants described above were rinsed with water and the etched surfaces were subjected to a secondary ion trace amount analysis. No impurity was found in each case.

Although the content of the aqueous solution of hydrogen peroxide was determined to be 30% in the foregoing etching operations, the content of the hydrogen peroxide solution can be freely selected within a range which does not impair the effect of addition of hydrogen peroxide and which does not cause any problem in, for example, preparation process.

Density and temperature of the solutions can be determined to fall within ranges which do not impair the effects produced by buffered hydrofluoric acid, aqueous solution of hydrogen peroxide and alcohol and which do not decrease the etching rate to a level unacceptable from the view point of practical production.

Thus, the densities of solutions mentioned in the foregoing description are only illustrative and solution temperatures other than room temperature may be employed although room temperature is specifically mentioned.

The HF concentration in the buffered hydrofluoric acid is preferably 1 to 95%, more preferably 1 to 85% and most preferably 1 to 70%, with respect to the whole etchant. On the other hand, the $NH_4F$ concentration in the buffered hydrofluoric acid is preferably determined to be 1 to 95%, more preferably 5 to 90% and most preferably 5 to 80%, with respect to the whole etchant.

The $H_2O_2$ concentration is preferably selected to be 1 to 95%, more preferably 5 to 90% and most preferably 10 to 80%, with respect to the whole etchant, and is determined to fall within the range which does not impair the effect of the addition of hydrogen peroxide.

The concentration of alcohol is preferably not more than 80%, more preferably not more than 60% and most preferably not more than 40%, and is determined to fall within a range which does not impath the effect produced by the addition of the alcohol.

The temperature of the etchant preferably ranges from 0° to 100° C. more preferably 5° to 80° C. and most preferably 5° to 60° C.

The alcohol used in the present invention may be isopropyl alcohol, as well as ethyl alcohol, and any other alcohol which does not cause impediment on the production process and which can produce the above-described effect of addition of the alcohol to an appreciable level.

A description will now be given of a method of processing Si substrate with the etchants mentioned hereinbefore.

Figure 1A:
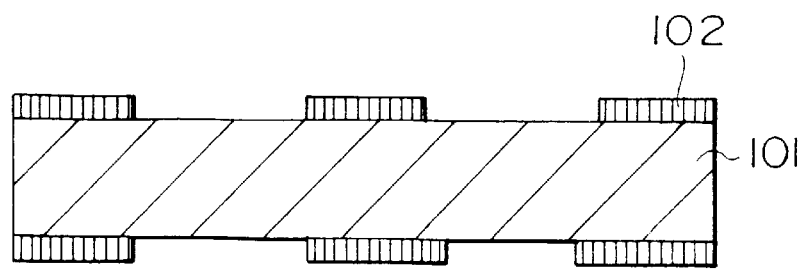
FIGS. 1(*a*) to 1(*c*) are schematic illustrations of an embodiment of the method in accordance with the present invention.
Figure 1B:
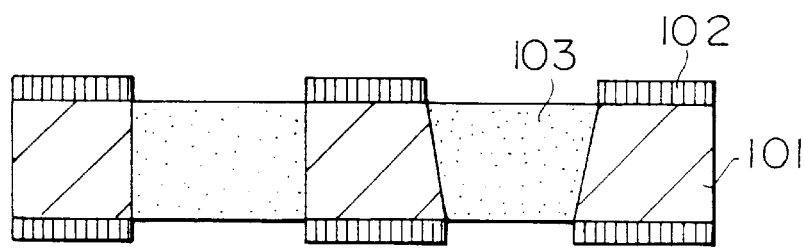
Figure 1C:
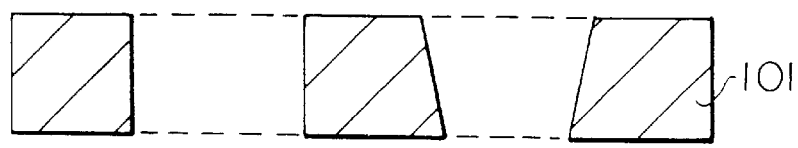

FIGS. 1(a) to 1(c) illustrate an example in which both upper and lower surfaces of a non-porous Si are covered by masks and exposed portions on both surfaces are changed into porous Si as a result of a selective etching.

As will be seen from FIG. 1(a), both the upper and lower surfaces of a non-porous Si 101 are partly covered by masks 102 in such a manner as to leave windows where the non-porous Si is exposed. A material having high resistance to hydrofluoric acid, Apiezon wax, an epitaxial film having high resistance or a high-resistance non-epitaxial deposition film can be used as the material of the mask.

Referring now to FIG. 1(b), the exposed portions of the non-porous Si are changed into porous Si over the entire thickness thereof, i.e., from one to the other surface whole through the thickness. Since the porous Si regions 103 are formed along the flow of anodizing electrical current, the porous Si regions can be formed in a desired configuration when masks 102 of suitable shape are used.

Then, after separating the masks 102, only the porous Si regions are selectively removed by wet chemical etching conducted with one of the eight types of etchants described above. Needless to say, the masks 102 may be separated after the selective etching. Obviously, if the masks 102 are of a material which does not cause any undesirable effect on the application of the process product, e.g., an epitaxial layer, it is not necessary to remove the masks 102.

FIG. 1(c) shows the Si product after completion of the etching. As will be seen from this Figure, it is possible to form at least one hole of a desired configuration in a non-porous Si completely penetrating the non-porous Si from one to the other side.

The hole can have a vertical wall if the masks are so configured and positioned that vertically aligned windows are provided on both sides of the non-porous Si. Likewise, a slant wall surface can be obtained when the masks are provided such that the windows on both sides of the non-porous Si are deviated from each other when viewed in plan.

Embodiment 2

Figure 2A:
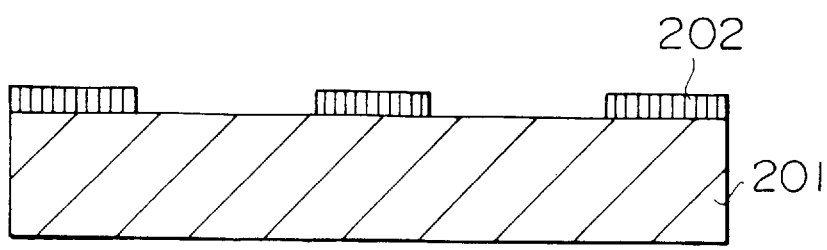
FIGS. 2(*a*) to 2(*c*) are schematic illustrations of another embodiment of the method in accordance with the present invention.
Figure 2B:
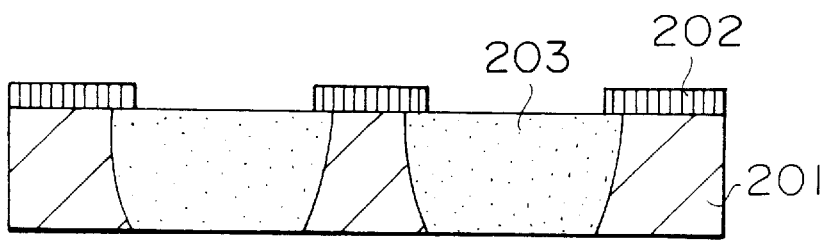
Figure 2C:
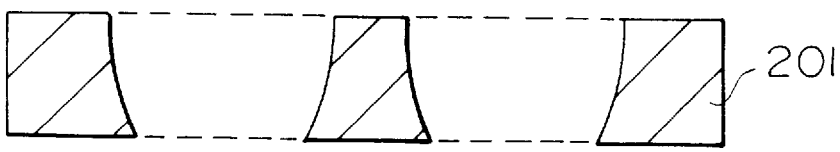

FIGS. 2(a) to 2(c) illustrate an embodiment in which the upper surface of a non-porous Si are covered by a mask and exposed portions are selectively changed into porous Si from the upper to the lower surfaces of the non-porous Si.

As will be seen from FIG. 2(a), the upper surface of a non-porous Si 201 is partly covered by a mask 202 in such a manner as to leave windows where the non-porous Si is exposed. A material having high resistance to hydrofluoric acid, Apiezon wax, an epitaxial film having high resistance or a high-resistance non-epitaxial deposition film can be used as the material of the mask.

Referring now to FIG. 2(b), the exposed portions of the non-porous Si are changed into porous Si over the entire thickness thereof, i.e., from the upper to the lower surface whole through the thickness.

Then, after separating the masks 202, only the porous Si regions are selectively removed by wet chemical etching conducted with one of the eight types of etchants described above. Needless to say, the masks 202 may be separated after the selective etching. Obviously, if the masks 202 are of a material which does not cause any undesirable effect on the application of the process product, e.g., an epitaxial layer, it is not necessary to remove the masks 202.

FIG. 2(c) shows the Si product after completion of the etching. As will be seen from this Figure, it is possible to form at least one hole of a desired configuration in a non-porous Si completely penetrating the non-porous Si from one to the other side.

Embodiment 3

Figure 3A:
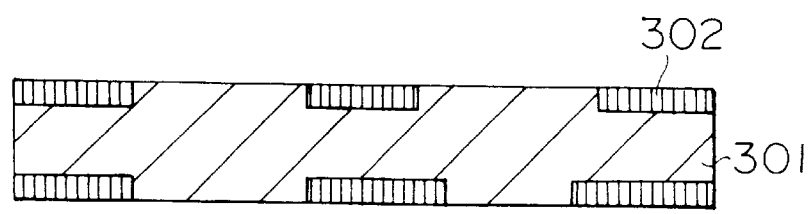
FIGS. 3(*a*) to 3(*c*) are schematic illustrations of still another embodiment of the method in accordance with the present invention.
Figure 3B:
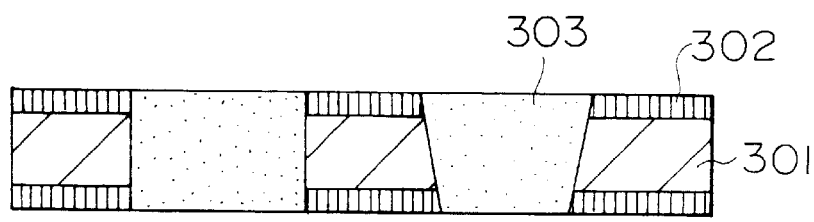
Figure 3C:
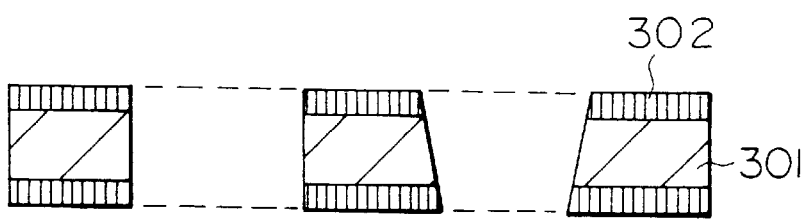

FIGS. 3(a) to 3(c) shows an embodiment in which both upper and lower surfaces of a non-porous Si are treated to have local high-resistance regions and exposed low-resistance portions on both surfaces are selectively changed into porous Si.

As will be seen from FIG. 3(a), both the upper and lower surfaces of a non-porous Si 301 are treated to have local high-resistance region 302 in such a manner that at least one low-resistance region is exposed in each surface of the non-porous Si. The local high-resistance regions can be formed by ion implantation, impurity diffusion or other non-deposition method.

Referring now to FIG. 3(b), the exposed low-resistance regions of the non-porous Si are changed into porous Si over the entire thickness thereof, i.e., from one to the other surface whole through the thickness. Since the porous Si regions 303 are formed along the flow of anodizing electrical current, the porous Si regions can be formed in a desired configuration when the configuration of the high-resistance regions 302 is suitably selected.

Then, after separating the masks 102, only the porous Si regions 303 are selectively removed by wet chemical etching conducted with one of the eight types of etchants described above.

FIG. 3(c) shows the Si product after completion of the etching. As will be seen from this Figure, it is possible to form at least one hole of a desired configuration in a non-porous Si completely penetrating the non-porous Si from one to the other side.

The hole can have a vertical wall if the masks are so configured and positioned that vertically aligned high-resistance regions 302 are provided on both sides of the non-porous Si. Likewise, a slant wall surface can be obtained when the masks are provided such that the windows on both sides of the non-porous Si are deviated from each other when viewed in plan.

Embodiment 4

Figure 4A:
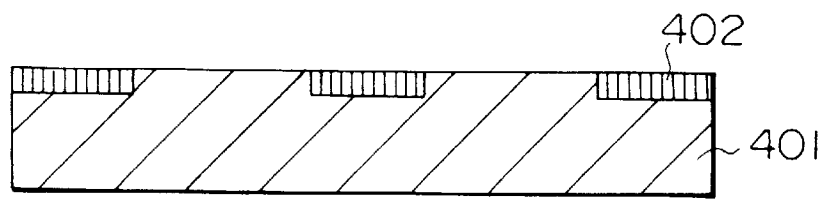
FIGS. 4(*a*) to 4(*c*) are schematic illustrations of a further embodiment of the method in accordance with the present invention.
Figure 4B:
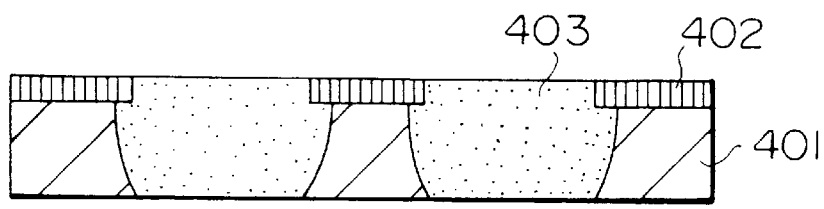
Figure 4C:
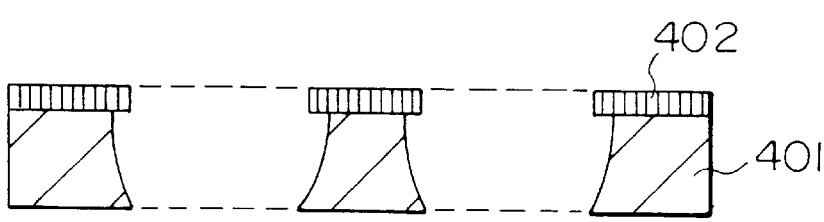

FIGS. 4(a) to 4(c) shows an embodiment in which the upper surface of a non-porous Si is treated to have local high-resistance regions and exposed low-resistance portions are selectively changed into porous Si.

As will be seen from FIG. 4(a), the upper surface of a non-porous Si 401 is treated to have local high-resistance regions 402 in such a manner that at least one low-resistance region is exposed in the upper surface of the non-porous Si. The local high-resistance regions 402 can be formed by ion implantation, impurity diffusion or other non-deposition method.

Referring now to FIG. 4(b), the exposed low-resistance regions of the non-porous Si are changed into porous Si over the entire thickness thereof, i.e., from the upper to the lower sides of the non-porous Si.

Then, only the porous Si regions 403 are selectively removed by wet chemical etching conducted with one of the eight types of etchants described above.

FIG. 4(c) shows the Si product after completion of the etching. As will be seen from this Figure, it is possible to form at least one hole of a desired configuration in a non-porous Si completely penetrating the non-porous Si from one to the other side.

Embodiment 5

A description will now be given of an embodiment in which both upper and lower surfaces of a non-porous Si are covered by masks and exposed portions on both surfaces are selectively changed into porous Si, followed by formation of a layer which functions as an etching stop layer and which finally forms an unsupported membrane.

Figure 5A:
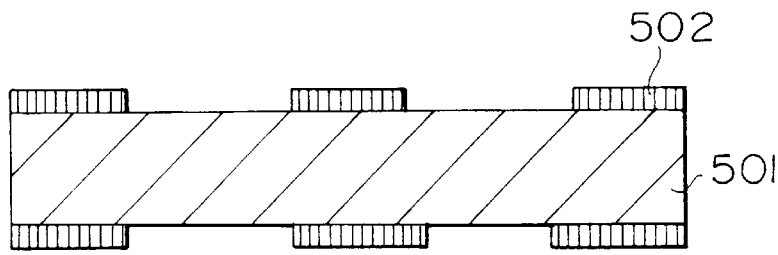
FIGS. 5(*a*) to 5(*e*) are schematic illustrations of a different embodiment of the method in accordance with the present invention.

As will be seen from FIG. 5(a), both the upper and lower surfaces of a non-porous Si 501 are partly covered by masks 502 in such a manner as to leave windows where the non-porous Si is exposed. A material having high resistance to hydrofluoric acid, Apiezon wax, an epitaxial film having high resistance or a high-resistance non-epitaxial deposition film can be used as the material of the mask.

Figure 5B:
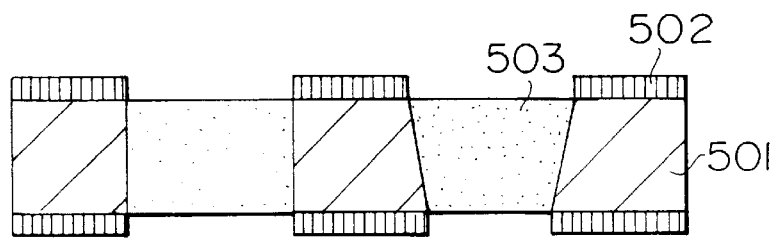

Referring now to FIG. 5(b), the exposed portions of the non-porous Si are changed into porous Si over the entire thickness thereof, i.e., from one to the other surface whole through the thickness.

Figure 5C:
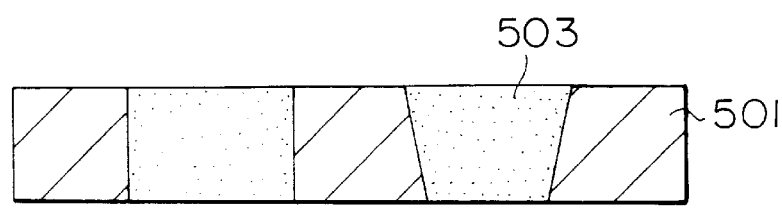
Figure 5D:
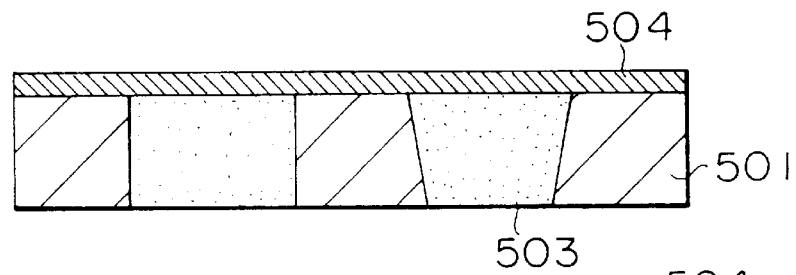

Then, after separating the masks 502 as shown in FIG. 5(c), a layer 504 is formed on either one surface of the non-porous Si, as shown in FIG. 5(d). This layer 504 serves as an etching stop layer and finally forms an unsupported layer. This layer 504 may have a laminate structure formed of a plurality of layers. Then, only the porous Si regions 503 are selectively removed by wet chemical etching conducted with one of the eight types of etchants described above. Obviously, if the masks 502 are of a material which does not cause any undesirable effect on the application of the process product, e.g., an epitaxial layer, it is not necessary to remove the masks 502 on the surface of the porous Si 501 other than the surface on which the etching stop layer 504 is formed.

Figure 5E:
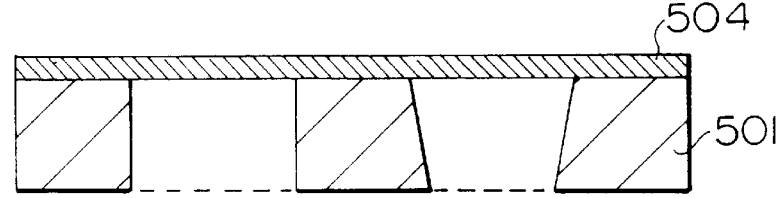

FIG. 5(e) shows the Si product after completion of the etching. As will be seen from this Figure, it is possible to form at least one hole in a non-porous Si so as to form a region where the membrane 504 has no support.

The hole can have a vertical wall if the masks are so configured and positioned that vertically aligned windows are provided on both sides of the non-porous Si. Likewise, a slant wall surface can be obtained when the masks are provided such that the windows on both sides of the non-porous Si are deviated from each other.

Embodiment 6

FIGS. 6(a) to 6(e) and FIGS. 7(a) to 7(e) show an embodiment in which the upper surface of a non-porous Si is covered by a mask and exposed portions are selectively changed into porous Si, followed by formation of a layer which functions as an etching stop layer and which finally forms an unsupported membrane.

Figure 6A:
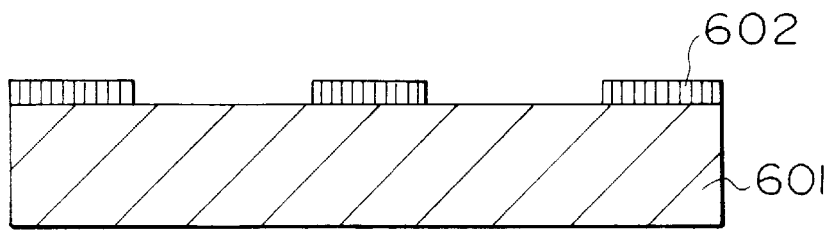
FIGS. 6(*a*) to 6(*e*) are schematic illustrations of a different embodiment of the method in accordance with the present invention.
Figure 7A:
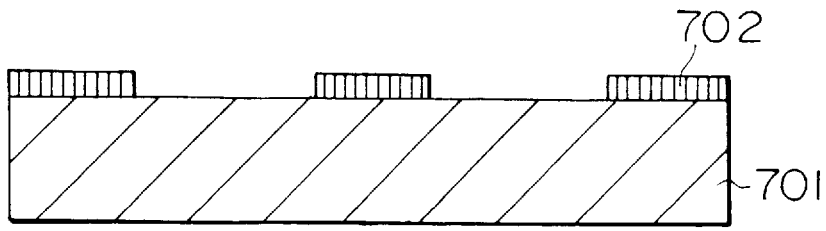
FIGS. 7(*a*) to 7(*e*) are schematic illustrations of a different embodiment of the method in accordance with the present invention.

As will be seen from FIGS. 6(a) and 7(a), both the upper surface of a non-porous Si 601 (701) are partly covered by a mask 602 (702) in such a manner as to leave windows where the non-porous Si is exposed.

Figure 6B:
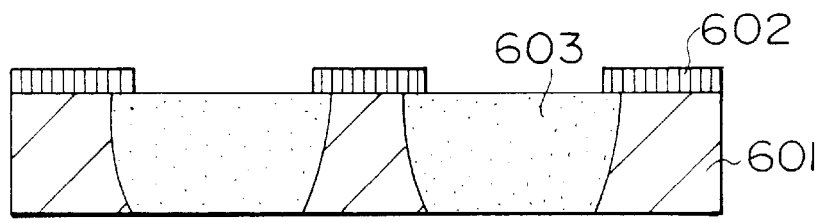
Figure 7B:
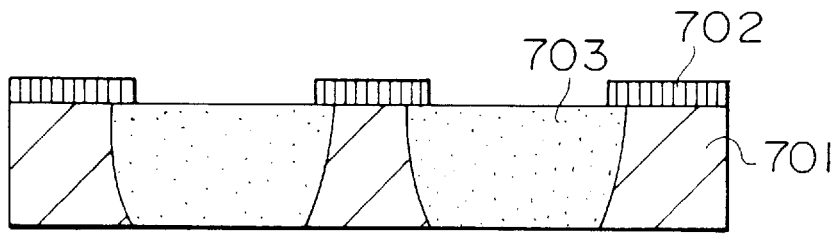

Referring now to FIGS. 6(b) and 7(b), the exposed portions of the non-porous Si are changed into porous Si 603 (703) over the entire thickness thereof, i.e., from one to the other surface whole though the thickness.

Figure 6C:
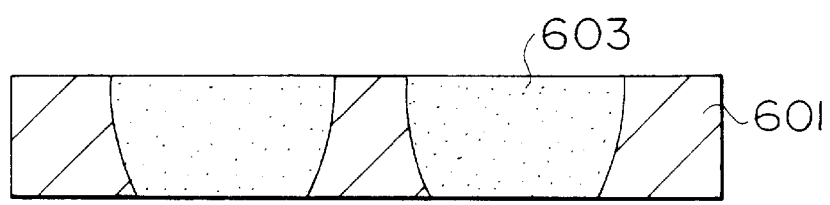
Figure 6D:
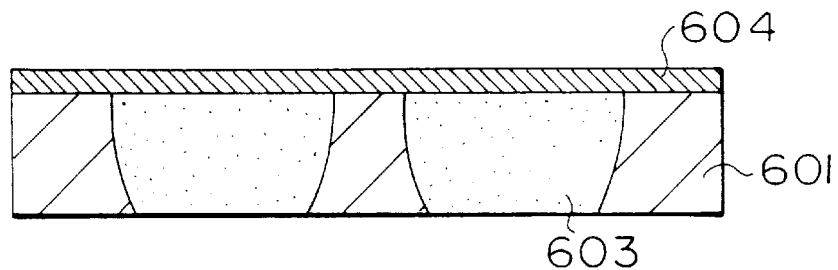
Figure 7C:
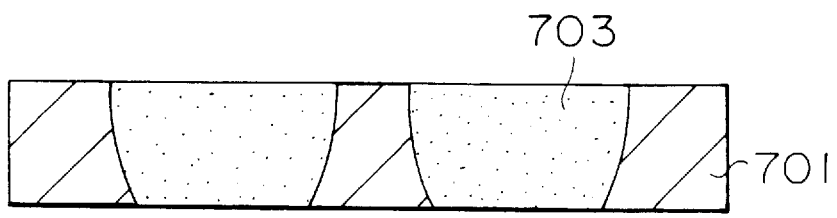
Figure 7D:
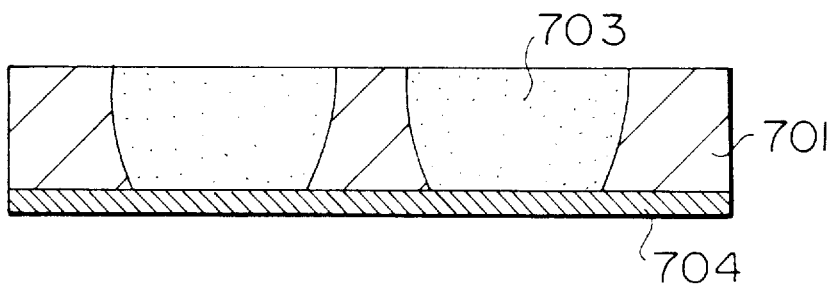

Then, after separating the masks 602 (702) as shown in FIGS. 6(c) and 7(c), a layer 604 (704) is formed on either one surface of the non-porous Si, as shown in FIGS. 6(d) and 7(d). This layer 604 (704) serves as an etching stop layer and finally forms an unsupported membrane. More specifically, FIG. 6(d) shows the case where the etching stop layer 604 is provided on the surface from which the mask 602 has been removed, whereas FIG. 7(d) shows the case where the etching stop layer 704 is provided on the surface opposite to the masked surface. This layer 604 (704) may have a laminate structure formed of a plurality of layers. Then, only the porous Si regions 603 (703) are selectively removed by wet chemical etching conducted with one of the eight types of etchants described above. Obviously, if the masks 602 (702) are of a material which does not cause any undesirable effect on the application of the process product, e.g., an epitaxial layer, it is not necessary to remove the mask.

Figure 6E:
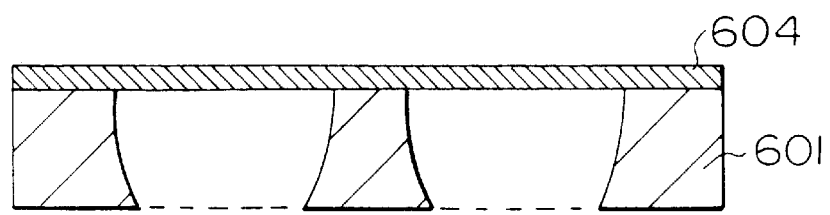
Figure 7E:
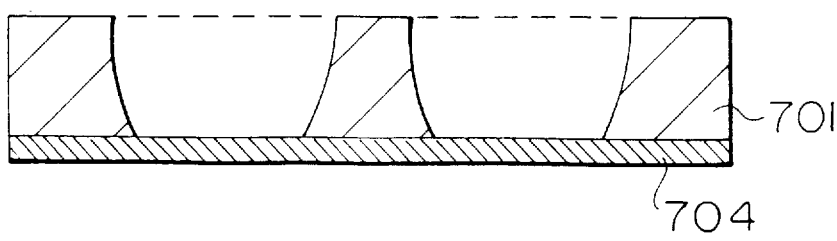

FIGS. 6(e) and 7(e) show the Si products after completion of the etching. As will be seen from these Figures, it is possible to form at least one hole of a desired configuration in a non-porous Si so as to leave a membrane region which has no support on the lower side or upper side thereof.

Embodiment 7

FIGS. 8(a) to 8(d) show an embodiment in which both upper and lower surfaces of a non-porous Si are treated to have local high-resistance portions, and exposed low-resistance portions are changed into porous Si whole through the thickness of the non-porous Si, followed by formation of a layer which functions as an etching stop layer and which finally forms an unsupported membrane.

Figure 8A:
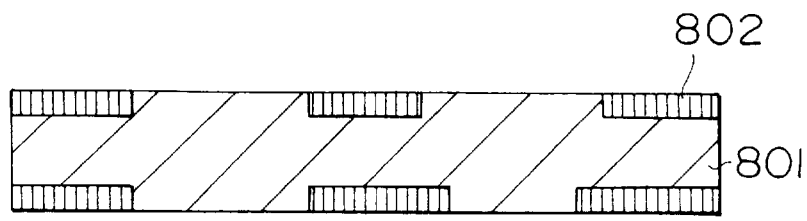
FIGS. 8(*a*) to 8(*d*) are schematic illustrations of a different embodiment of the method in accordance with the present invention.

As will be seen from FIG. 8(a), both the upper and lower surfaces of a non-porous Si 801 are treated to have local high-resistance regions 802 in such a manner as to leave at least one region where the original low-resistance region 801 is exposed in each surface of the non-porous Si. The high-resistance region 802 can be formed by ion implantation, impurity diffusion or other non-deposition method.

Figure 8B:
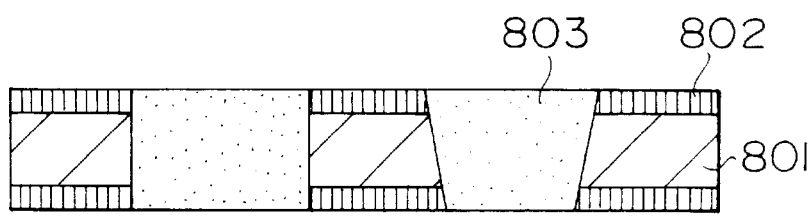

Referring now to FIG. 8(b), the exposed low-resistance portions of the non-porous Si are changed into porous Si 803 over the entire thickness thereof, i.e., from one to the other surface whole through the thickness.

Figure 8C:
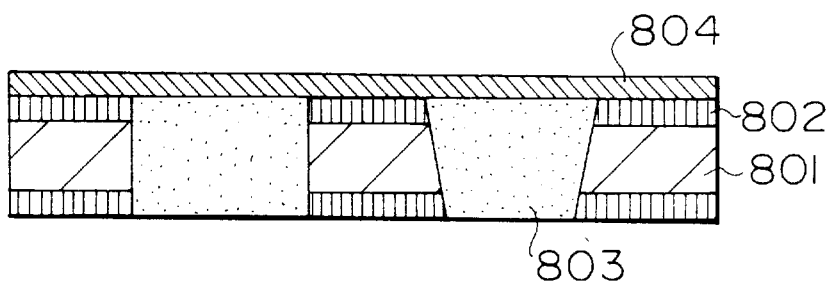

Then, as shown in FIG. 8(c), a layer 804 is formed on either one surface of the non-porous Si. This layer 804 serves as an etching stop layer and finally forms an unsupported layer. This layer 804 may have a laminate structure formed of a plurality of layers. Then, only the porous Si regions 803 are selectively removed by wet chemical etching conducted with one of the eight types of etchants described above.

Figure 8D:
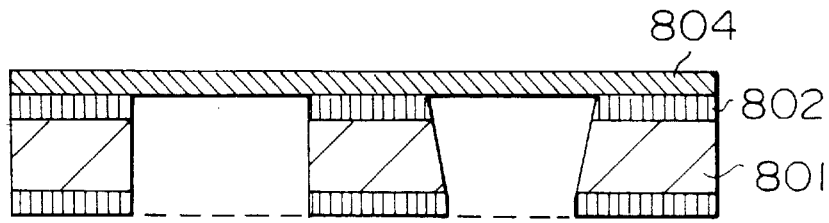

FIG. 8(d) shows the Si product after completion of the etching. As will be seen from this Figure, it is possible to form at least one hole of a desired configuration in a non-porous Si, leaving a membrane which has no support under it.

The hole can have a vertical wall if the high-resistance regions on both surfaces are vertically aligned. Likewise, a slant wall surface can be obtained when the masks are provided such that the high-resistance on both sides of the non-porous Si are deviated from each other when viewed in plan.

Embodiment 8

FIGS. 9(a) to 9(d) and FIGS. 10(a) to 10(d) show an embodiment in which both upper and lower surfaces of a non-porous Si are treated to have local high-resistance portions, and exposed low-resistance portions are changed into porous Si whole through the thickness of the non-porous Si, followed by formation of a layer which functions as an etching stop layer and which finally forms an unsupported membrane.

Figure 9A:
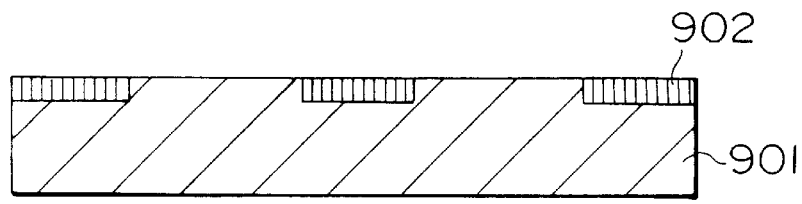
FIGS. 9(*a*) to 9(*d*) are schematic illustrations of a different embodiment of the method in accordance with the present invention.
Figure 10A:
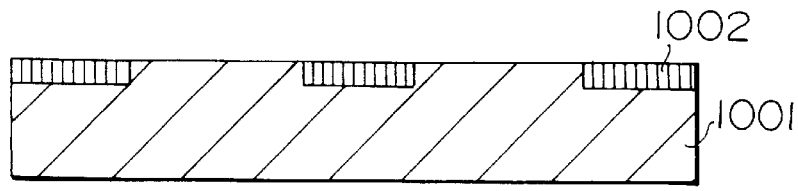
FIGS. 10(*a*) to 10(*d*) are schematic illustrations of a different embodiment of the method in accordance with the present invention.

As will be seen from FIGS. 9(a) and 10(a), one surface of a non-porous Si 901 (1001) is treated to have local high-resistance regions 902 (1002) in such a manner as to leave at least one region where the original low-resistance region 901 (1001) is exposed in the surface of the non-porous Si. The high-resistance region 902 (1002) can be formed by ion implantation, impurity diffusion or other non-deposition method.

Figure 9B:
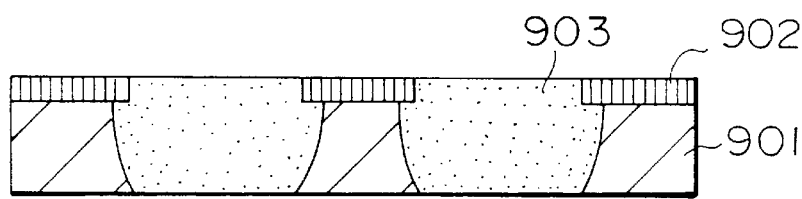
Figure 10B:
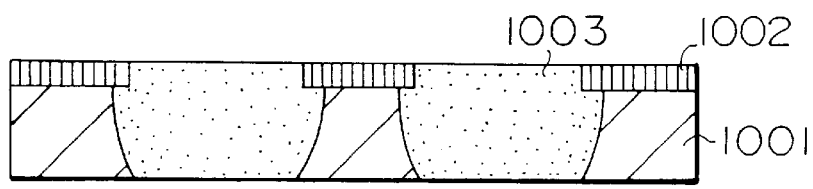

Referring now to FIGS. 9(b) and 10(b), the exposed low-resistance portions of the non-porous Si are changed into porous Si 903 (1003) over the entire thickness thereof, i.e., from one to the other surface whole through the thickness.

Figure 9C:
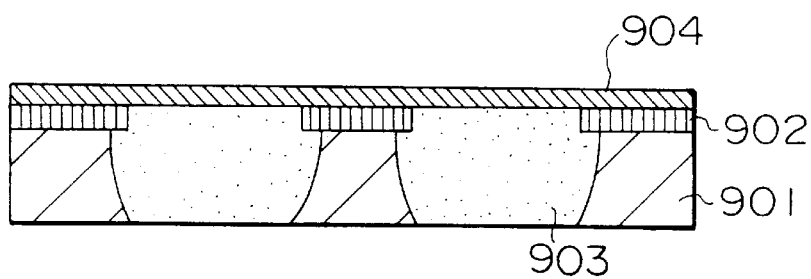
Figure 9D:
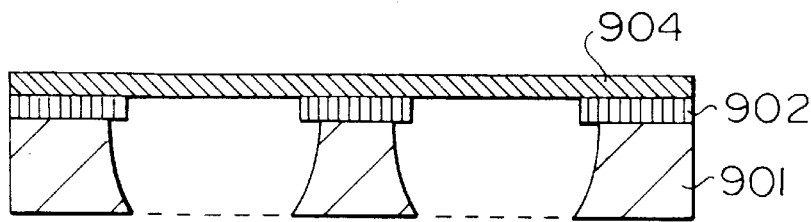
Figure 10C:
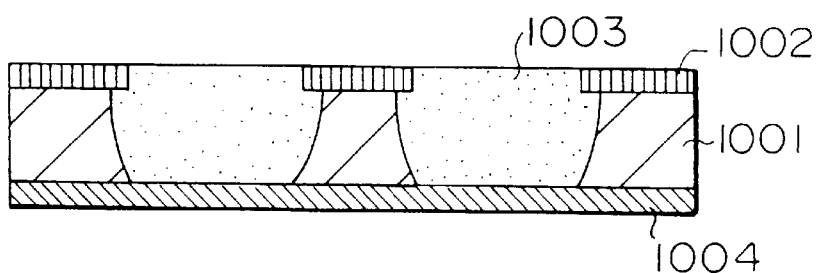
Figure 10D:
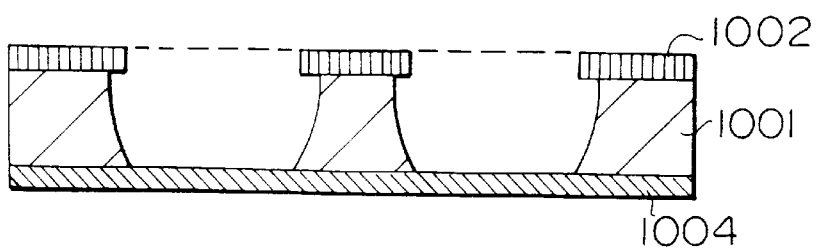

Then, as shown in FIGS. 9(c) and 10(c), a layer 904 (1004) is formed on either one surface of the non-porous Si. This layer 904 (1004) serves as an etching stop layer and finally forms an unsupported membrane as shown in FIGS. 9(d) and 10(d).

Embodiment 9

FIGS. 11(a) to 11(d) show an embodiment in which a layer which functions as an etching stop layer and which finally forms an unsupported membrane is formed on one surface of a non-porous Si and then the other surface is covered by a mask so as to leave windows through which the non-porous Si is exposed, followed by an operation for changing the exposed low-resistance portions into porous Si whole through the thickness to reach the etching stop layer.

Figure 11A:
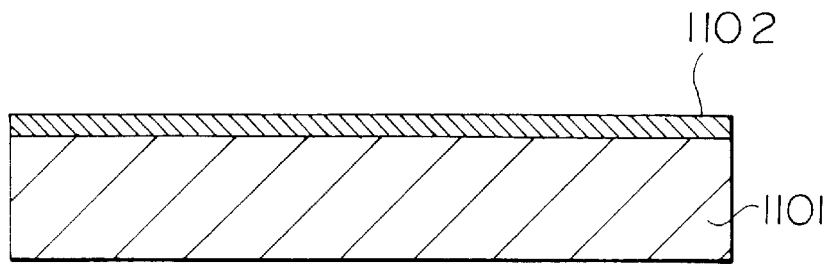
FIGS. 11(*a*) to 11(*d*) are schematic illustrations of a different embodiment of the method in accordance with the present invention.

As will be seen from FIG. 11(a), a layer 1102 which functions as an etching stop layer and which finally forms an unsupported membrane is formed on one surface of a non-porous Si 1101. This layer 1102 may have a laminate structure composed of a plurality of layers.

Figure 11B:
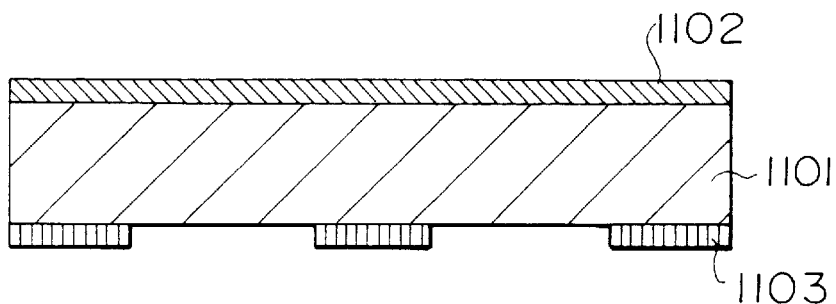
Figure 11C:
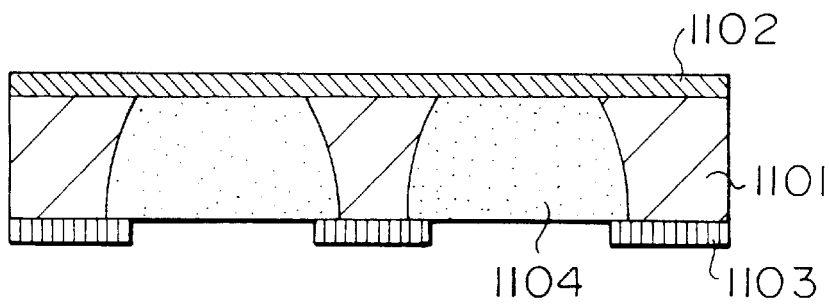

Then, as shown in FIG. 11(b), the surface of the non-porous Si opposite to the etching stop layer 1102 is covered by a mask 1103 so as to leave windows through which the non-porous Si is exposed. Then, the portions of the non-porous Si exposed through the windows are changed into porous Si 1104 whole through the thickness of the non-porous Si so as to reach the etching stop layer 1102, as shown in FIG. 11(c).

Subsequently, only the porous Si regions 1104 are selectively removed by wet chemical etching conducted with one of the eight types of etchants described above, after removal of the mask 1103.

When the mask is made of a material which does not produce any undesirable effect on the application of the product, e.g., an epitaxial layer, it is not necessary to remove the mask 1103 on the surface opposite to the etching stop layer 1102.

Figure 11D:
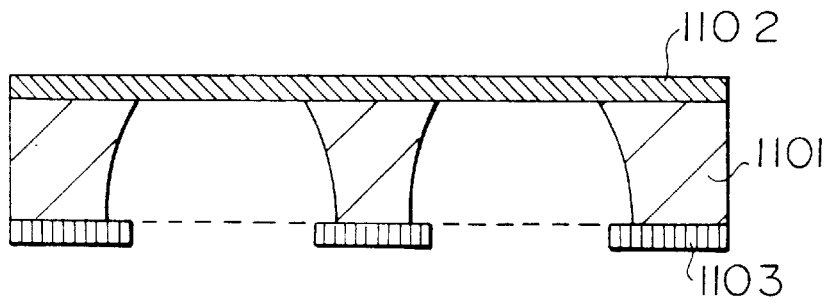

FIG. 11(d) shows the Si product after completion of the etching. As will be seen from this Figure, it is possible to form at least one hole of a desired configuration in a non-porous Si, leaving a membrane which has no support under it.

Embodiment 10

FIGS. 12(a) to 12(d) show an embodiment in which a layer which functions as an etching stop layer and which finally forms an unsupported membrane is formed on one surface of a non-porous Si and then the other surface is treated to have local high-resistance portions so as to leave windows through which the non-porous Si is exposed, followed by an operation to change the exposed low-resistance portions into porous Si whole through the thickness to reach the etching stop layer.

Figure 12A:
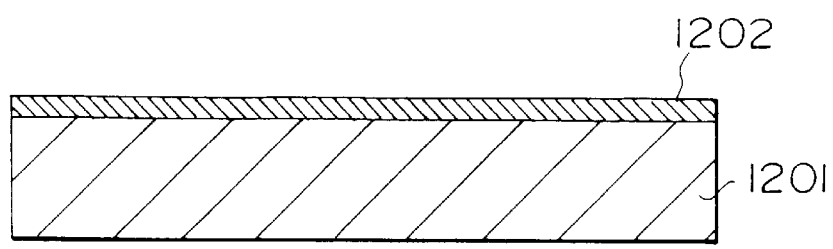
FIGS. 12(*a*) to 12(*d*) are schematic illustrations of a different embodiment of the method in accordance with the present invention.

As will be seen from FIG. 12(a), a layer 1202 which functions as an etching stop layer and which finally forms an unsupported membrane is formed on one surface of a non-porous Si 1201.

Figure 12B:
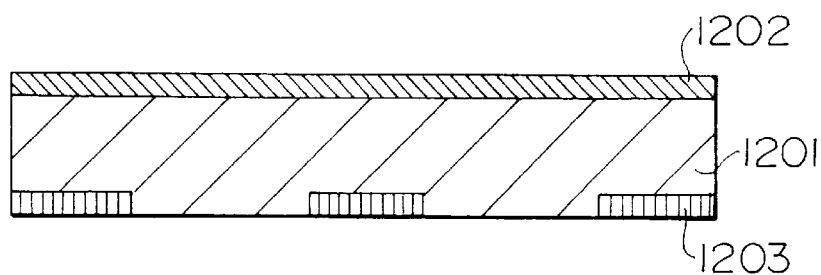
Figure 12C:
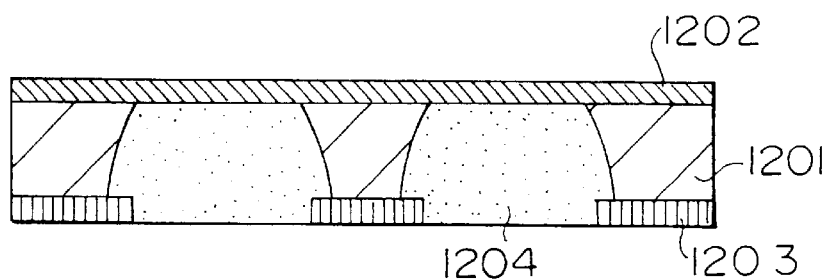

Then, as shown in FIG. 12(b), the surface of the non-porous Si opposite to the etching stop layer 1202 is treated to have local high-resistance regions 1203 in such a manner as to leave at least one portion where the original non-porous Si 1201 of low resistance is exposed. The high-resistance region 1203 can be formed by ion implantation, impurity diffusion or other non-deposition method. Then, the exposed low-resistance portion is changed into porous Si 1204 whole through the thickness of the non-porous Si 1201 so as to reach the etching stop layer 1202, as shown in FIG. 12(c).

Subsequently, only the porous Si regions 1204 are selectively removed by wet chemical etching conducted with one of the eight types of etchants described above, after removal of the mask 1103.

Figure 12D:
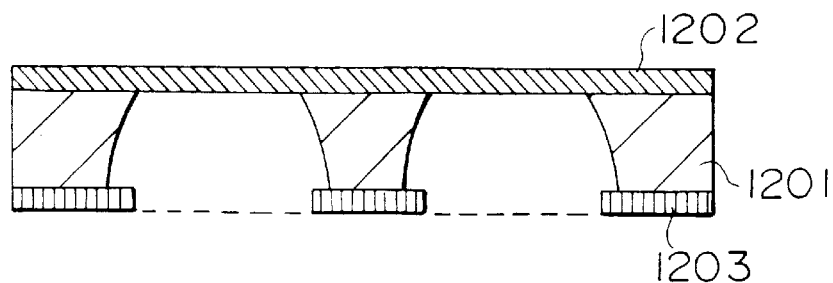

FIG. 12(d) shows the Si product after completion of the etching. As will be seen from this Figure, it is possible to form at least one hole of a desired configuration in a non-porous Si, leaving a membrane which has no support under it.

EXAMPLES

The invention will be fully understood from the following description of Examples.

Example 1

A high-resistance epitaxial Si layer of 0.5 μm thick was formed on each major surface of a low-resistance single crystal Si substrate of 200 μm thick by MBE (molecular beam epitaxy), under the following growing conditions:

Temperature: 700° C.

Pressure: $1 \times 10^{-9}$ Torr

Growth rate: 0.1 nm/sec

Then, a resist film of a predetermined pattern was formed on the epitaxial Si layer by lithographic technique, and the regions where the epitaxial Si layer were exposed were etched by RIE (reactive ion etching) method until the low-resistance single crystal Si appears. Thus, at least one exposed low-resistance region was formed on each side of the substrate. The low-resistance regions on both sides of the substrate were aligned with each other. Consequently, a mask was formed on each side of the substrate for the purpose of forming non-porous Si regions in a subsequent anodization step.

The anodization was conducted in an HF solution. The conditions of the anodization were as follows:

Current density: 30 ($mA \cdot cm^{-2}$)

Anodizing solution: HF: $H_2O$: $C_2H_5$=1:1:1

Time: 1.6 (hours)

Thickness of porous Si: 200 (μm)

Porosity: 56 (%)

Consequently, the regions which were not covered by the masks were changed into porous Si over the entire thickness from one to the other surfaces of the substrate. The substrate was then immersed in a bath of 49% hydrofluoric acid and the bath was agitated. Consequently, a selective etching was effected to remove only the porous Si regions in 78 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the mask pattern alone. The sole limitation was that the hole size must be smaller than the size of the substrate.

Although the mask used in this example was made of a high-resistance epitaxial Si film, the same result as that obtained by the described example was obtained by using masks of other high-resistance material having high resistance to hydrofluoric acid, such as an applied layer, a deposited layer or an epitaxial layer. The mask may be removed as desired after the anodization.

Example 2

A high-resistance epitaxial Si layer of 0.5 μm thick was formed on each major surface of a low-resistance single crystal Si substrate of 200 μm thick by reduced-pressure CVD (chemical vapor deposition) technique, under the following growing conditions:

Source gas: $SiH_4$

Carrier gas: $H_2$

Temperature: 850° C.

Pressure: $1 \times 10^{-2}$ Torr

Growth rate: 3.3 nm/sec

Then, a resist film of a predetermined pattern was formed on the epitaxial Si layer by lithographic technique, and the regions where the epitaxial Si layer were exposed were etched by RIE (reactive ion etching) method until the low-resistance single crystal Si appears. Thus, at least one exposed low-resistance region was formed on each side of the substrate. The low-resistance regions on both sides of the substrate were aligned with each other. Consequently, a mask was formed on each side of the substrate for the purpose of forming non-porous Si regions in a subsequent anodization step.

The anodization was conducted in an HF solution. The conditions of the anodization were as follows:

Current density: 30 ($mA \cdot cm^{-2}$)

Anodizing solution: HF: $H_2O$: $C_2H_5$=1:1:1

Time: 1.6 (hours)

Thickness of porous Si: 200 (μm)

Porosity: 56 (%)

Consequently, the regions which were not covered by the masks were changed into porous Si over the entire thickness from one to the other surfaces of the substrate. The substrate was then immersed in a mixture of 49% hydrofluoric acid and an alcohol (10:1). Consequently, a selective etching was effected to remove only the porous Si regions in 82 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the mask pattern alone. The sole limitation was that the hole size must be smaller than the size of the substrate.

Example 3

A high-resistance epitaxial Si layer of 3 μm thick was formed on each major surface of a low-resistance single crystal Si substrate of 200 μm thick by liquid phase epitaxy, under the following growing conditions:

Solvent: Sn
Growth temperature: 900° C.
Growth atmosphere: $H_2$
Growth time: 30 min Then, a resist film of a predetermined pattern was formed on the epitaxial Si layer by lithographic technique, and the regions where the epitaxial Si layer were exposed were etched by RIE (reactive ion etching) method until the low-resistance single crystal Si appears. Thus, at least one exposed low-resistance region was formed on each side of the substrate. The low-resistance regions on both sides of the substrate were aligned with each other. Consequently, a mask was formed on each side of the substrate for the purpose of forming non-porous Si regions in a subsequent anodization step.

The anodization was conducted in an HF solution. The conditions of the anodization were as follows:

Current density: 30 ($mA \cdot cm^{-2}$)
Anodizing solution: HF: $H_2O$: $C_2H_5$=1:1:1
Time: 1.6 (hours)
Thickness of porous Si: 200 (μm)
Porosity: 56 (%)

Consequently, the regions which were not covered by the masks were changed into porous Si over the entire thickness from one to the other surfaces of the substrate. The substrate was then immersed in a mixture of 49% hydrofluoric acid and an aqueous solution of hydrogen peroxide (1:5) and the mixture was agitated. Consequently, a selective etching was effected to remove only the porous Si regions in 62 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the mask pattern alone. The sole limitation was that the hole size must be smaller than the size of the substrate.

Example 4

A high-resistance epitaxial Si layer of 0.5 μm thick was formed on each major surface of a low-resistance single crystal Si substrate of 200 μm thick by bias sputtering technique, under the following growing conditions:

RF frequency: 100 MHz
RF power: 600 W
Ar gas pressure: $8 \times 10^{-3}$ Torr
D.C. bias: −200 V
Substrate D.C. bias: +5V
Temperature: 300° C.
Growth time: 60 min Then, a resist film of a predetermined pattern was formed on the epitaxial Si layer by lithographic technique, and the regions where the epitaxial Si layer were exposed were etched by RIE (reactive ion etching) method until the low-resistance single crystal Si appears. Thus, at least one exposed low-resistance region was formed on each side of the substrate. The low-resistance regions on both sides of the substrate were aligned with each other. Consequently, a mask was formed on each side of the substrate for the purpose of forming non-porous Si regions in a subsequent anodization step.

The anodization was conducted in an HF solution. The conditions of the anodization were as follows.

Current density: 30 ($mA \cdot cm^{-2}$)
Anodizing solution: HF: $H_2O$: $C_2H_5$=1:1:1
Time: 1.6 (hours)
Thickness of porous Si: 200 (μm)
Porosity: 56 (%)

Consequently, the regions which were not covered by the masks were changed into porous Si over the entire thickness from one to the other surfaces of the substrate. The substrate was then immersed in a mixture of 49% hydrofluoric acid, an alcohol and 30% aqueous solution of hydrogen peroxide (10:6:50). Consequently, a selective etching was effected to remove only the porous Si regions in 65 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the mask pattern alone. The sole limitation was that the hole size must be smaller than the size of the substrate.

Example 5

Apiezon wax was applied to local areas of each major surface of a low-resistance single crystal Si substrate of 200 μm thick, such that at least one low-resistance region is left exposed on each side of the substrate. The low-resistance regions on both sides of the substrate were aligned with each other. Consequently, a mask was formed on each side of the substrate for the purpose of forming non-porous Si regions in a subsequent anodization step.

The anodization was conducted in an HF solution. The conditions of the anodization were as follows:

Current density: 30 ($mA \cdot cm^{-2}$)
Anodizing solution: HF: $H_2O$: $C_2H_5$=1:1:1
Time: 1.6 (hours)
Thickness of porous Si: 200 (μm)
Porosity: 56 (%)

Consequently, the regions which were not covered by the masks were changed into porous Si over the entire thickness from one to the other surfaces of the substrate. The substrate was then immersed in a mixture of 49% hydrofluoric acid, an alcohol and 30% aqueous solution of hydrogen peroxide (10:6:50). Consequently, a selective etching was effected to remove only the porous Si regions in 65 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the mask pattern alone. The sole limitation was that the hole size must be smaller than the size of the substrate.

Example 6

A polyimide film of 1 μm thick, serving as a mask, was formed on each major surface of a low-resistance single crystal Si substrate of 200 μm thick, such that at least one low-resistance region is left exposed on each side of the substrate. The low-resistance regions on both sides of the substrate were deviated from each other when viewed in plan. Consequently, a mask was formed on each side of the substrate for the purpose of forming non-porous Si regions in a subsequent anodization step.

The anodization was conducted in an HF solution. The conditions of the anodization were as follows:

Current density: 30 ($mA \cdot cm^{-2}$)

Anodizing solution: HF: $H_2O$: $C_2H_5$=1:1:1

Time: 1.6 (hours)

Thickness of porous Si: 200 ($\mu$m)

Porosity: 56 (%)

Consequently, the regions which were not covered by the masks were changed into porous Si over the entire thickness from one to the other surfaces of the substrate. The substrate was then immersed in a mixture of 49% hydrofluoric acid, an alcohol and 30% aqueous solution of hydrogen peroxide (10:6:50). Consequently, a selective etching was effected to remove only the porous Si regions in 65 minutes. It was thus possible to obtain a single crystal Si substrate having at least one hole wholly penetrating through the substrate from one to the other side. The hole had a wall surface which is inclined to the surfaces of the substrate at an angle corresponding to the amount of deviation between the mask windows on both sides of the substrate. The configuration and the size of the hole could be determined by the mask pattern alone. The sole limitation was that the hole size must be smaller than the size of the substrate.

Example 7

A high-resistance epitaxial Si layer of 0.5 $\mu$m thick was formed on one major surface of a low-resistance single crystal Si substrate of 200 $\mu$m thick by MBE (molecular beam epitaxy), under the following growing conditions:

Temperature: 700° C.

Pressure: $1\times10^{-9}$ Torr

Growth rate: 0.1 nm/sec

Then, a resist film of a predetermined pattern was formed on the epitaxial Si layer by lithographic technique, and the regions where the epitaxial Si layer were exposed were etched by RIE (reactive ion etching) method until the low-resistance single crystal Si appears. Thus, at least one exposed low-resistance region was formed on each side of the substrate. The low-resistance regions on both sides of the substrate were aligned with each other. Consequently, a mask was formed on each side of the substrate for the purpose of forming non-porous Si regions in a subsequent anodization step.

The anodization was conducted in an HF solution. The conditions of the anodization were as follows:

Current density: 30 (mA·cm$^{-2}$)

Anodizing solution: HF: $H_2O$: $C_2H_5$=1:1:1

Time: 1.6 (hours)

Thickness of porous Si: 200 ($\mu$m)

Porosity: 56 (%)

Consequently, the regions which were not covered by the masks were changed into porous Si over the entire thickness from one to the other surfaces of the substrate. The substrate was then immersed in a mixture of 49% hydrofluoric acid, an alcohol and 30% aqueous solution of hydrogen peroxide (10: 6: 50). Consequently, a selective etching was effected to remove only the porous Si regions in 65 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the mask pattern alone. The sole limitation was that the hole size must be smaller than the size of the substrate.

Although the mask used in this example was made of a high-resistance epitaxial Si film, the same result as that obtained by the described example was obtained by using masks of other high-resistance material having high resistance to hydrofluoric acid, such as an applied layer, a deposited layer or an epitaxial layer. The mask may be removed as desired after the anodization.

The same result was obtained when any one of the etchants used in the preceding examples was used in place of the mixture of 49% hydrofluoric acid, an alcohol and 30% aqueous solution of hydrogen peroxide (10:6:50).

Example 8

Each major surface of a 200 $\mu$m-thick P-type low-resistance single crystal Si substrate (B concentration: $1\times10^{19}$ cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: $P^+$

Energy: 120 KeV

Implantation rate: $2\times10^{14}$ cm$^{-2}$

Heat treatment: 900° C., 30 min

Consequently, at least one low-resistance region where ions were not injected was formed in each surface of the single crystal Si substrate. The low-resistance regions on both surfaces were aligned with each other. Thus, a mask was formed on each surface of the Si substrate for the purpose of forming non-porous Si regions by an anodization which is to be conducted subsequently.

The anodization was conducted in an HF solution. The conditions of the anodization were as follows:

Current density: 30 (mA·cm$^{-2}$)

Anodizing solution: HF: $H_2O$: $C_2H_5$=1:1:1

Time: 1.6 (hours)

Thickness of porous Si: 200 ($\mu$m)

Porosity; 56 (%)

Consequently, the regions where ions were not injected were changed into porous Si over the entire thickness from one to the other surfaces of the substrate. The substrate was then immersed in a bath of 49% buffered hydrofluoric acid (4.5% HF+36% $NH_4F$+$H_2O$) and the bath was agitated. Consequently, a selective etching was effected to remove only the porous Si regions in 258 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

Example 9

Each major surface of a 200 $\mu$m-thick P-type low-resistance single crystal Si substrate (B concentration: $2\times10^{17}$ cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: $H^+$

Energy: 100 KeV

Implantation rate: $2 \times 10^{14}$ cm$^{-2}$

Heat treatment: 500° C., 30 min

Consequently, at least one low-resistance region where ions were not injected was formed in each surface of the single crystal Si substrate. The low-resistance regions on both surfaces were aligned with each other. Thus, a mask was formed on each surface of the Si substrate for the purpose of forming non-porous Si regions by an anodization which is to be conducted subsequently.

The anodization was conducted in an HF solution. The conditions of the anodization were as follows:

Current density: 30 (mA·cm$^{-2}$)

Anodizing solution: HF: H$_2$O: C$_2$H$_5$=1:1:1

Time: 1.6 (hours)

Thickness of porous Si: 200 ($\mu$m)

Porosity: 56 (%)

Consequently, the regions where ions were not injected were changed into porous Si over the entire thickness from one to the other surfaces of the substrate. The substrate was then immersed in a mixture of 49% buffered hydrofluoric acid (4.5% HF+36% NH$_4$F+H$_2$O) and an alcohol (10:1). Consequently, a selective etching was effected to remove only the porous Si regions in 275 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

Example 10

Each major surface of a 200 $\mu$m-thick N-type low-resistance single crystal Si substrate (B concentration: 1 ×10$^{19}$ cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: B$^+$

Energy: 150 KeV

Implantation rate: $4 \times 10^{14}$ cm$^{-2}$

Heat treatment: 900° C., 30 min

Consequently, at least one low-resistance region where ions were not injected was formed in each surface of the single crystal Si substrate. The low-resistance regions on both surfaces were aligned with each other. Thus, a mask was formed on each surface of the Si substrate for the purpose of forming non-porous Si regions by an anodization which is to be conducted subsequently.

The anodization was conducted in an HF solution. The conditions of the anodization were as follows:

Current density: 30 (mA·cm$^{-2}$)

Anodizing solution: HF: H$_2$O: C$_2$H$_5$1:1:1

Time: 1.6 (hours)

Thickness of porous Si: 200 ($\mu$m)

Porosity: 56 (%)

Consequently, the regions where ions were not injected were changed into porous Si over the entire thickness from one to the other surfaces of the substrate. The substrate was then immersed in a mixture of 49% buffered hydrofluoric acid (4.5% HF+36% NH$_4$F+H$_2$O) and a 30% aqueous solution of hydrogen peroxide (1:5) and the mixture was agitated. Consequently, a selective etching was effected to remove only the porous Si regions in 191 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

Example 11

Each major surface of a 200 $\mu$m-thick P-type low-resistance single crystal Si substrate (B concentration: 1 ×10$^{19}$ cm$^3$) was masked by a resist and the portions of the Si substrate exposed through windows formed in the mask were changed into high-resistance regions by ion implantation and a subsequent heat treatment. The conditions of ion implantation and heat treatment were as follows:

Ion seed: P$^+$

Energy: 120 KeV

Implantation rate: $2 \times 10^{14}$ cm$^{-2}$

Heat treatment: 900° C., 30 min

Consequently, at least one low-resistance region where ions were not injected was formed in each surface of the single crystal Si substrate. The low-resistance regions on both surfaces were aligned with each other. Thus, a mask was formed on each surface of the Si substrate for the purpose of forming non-porous Si regions by an anodization which is to be conducted subsequently.

The anodization was conducted in an HF solution. The conditions of the anodization were as follows:

Current density: 30 (mA·cm$^{-2}$)

Anodizing solution: HF: H$_2$O: C$_2$H$_5$=1:1:1

Time: 1.6 (hours)

Thickness of porous Si: 200 ($\mu$m)

Porosity: 56 (%)

Consequently, the regions where ions were not injected were changed into porous Si over the entire thickness from one to the other surfaces of the substrate. The substrate was then immersed in a mixture of 49% buffered hydrofluoric acid (4.5% HF+36% NH$_4$F+H$_2$O), an alcohol and a 30% aqueous solution of hydrogen peroxide (10:6: 50). Consequently, a selective etching was effected to remove only the porous Si regions in 205 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

Example 12

Each major surface of a 200 μm-thick P-type low-resistance single crystal Si substrate (B concentration: $1 \times 10^{19}$ cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: P$^+$
Energy: 120 KeV
Implantation rate: $2 \times 10^{14}$ cm$^{-2}$
Heat treatment: 900° C., 30 min Consequently, at least one low-resistance region where ions were not injected was formed in each surface of the single crystal Si substrate. The low-resistance regions on both surfaces were deviated from each other when viewed in plan. Thus, a mask was formed on each surface of the Si substrate for the purpose of forming non-porous Si regions by an anodization which is to be conducted subsequently.

The anodization was conducted in an HF solution. The conditions of the anodization were as follows:

Current density: 30 (mA·cm$^{-2}$)
Anodizing solution: HF: H$_2$O: C$_2$H$_5$=1:1:1
Time: 1.6 (hours)
Thickness of porous Si: 200 (μm)
Porosity: 56 (%)

Consequently, the regions where ions were not injected were changed into porous Si over the entire thickness from one to the other surfaces of the substrate. The substrate was then immersed in a mixture of 49% buffered hydrofluoric acid (4.5% HF+36% NH$_4$F+H$_2$O), an alcohol and a 30% aqueous solution of hydrogen peroxide (10:6: 50. Consequently, a selective etching was effected to remove only the porous Si regions in 205 minutes. It was thus possible to obtain a single crystal Si substrate having at least one hole wholly penetrating through the substrate from one to the other side. The hole had a wall surface which is inclined to the surfaces of the substrate at an angle corresponding to the amount of deviation of the mask windows between both sides of the substrate. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

Example 13

At least one major surface of a 200 μm-thick P-type low-resistance single crystal Si substrate (B concentration: $1 \times 10^{19}$ cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: P$^+$
Energy: 120 KeV
Implantation rate: $2 \times 10^{14}$ cm$^{-2}$
Heat treatment: 900° C., 30 min Consequently, at least one low-resistance region where ions were not injected was formed in each surface of the single crystal Si substrate. Thus, a mask was formed on each surface of the Si substrate for the purpose of forming non-porous Si regions by an anodization which is to be conducted subsequently.

The anodization was conducted in an HF solution. The conditions of the anodization were as follows:

Current density: 15 (mA·cm$^{-2}$)
Anodizing solution: HF: H$_2$O: C$_2$H$_5$=1:1:1
Time: 2.6 (hours)
Thickness of porous Si: 200 (μm)
Porosity: 56 (%)

Consequently, the regions where ions were not injected were changed into porous Si over the entire thickness from one to the other surfaces of the substrate. The substrate was then immersed in a mixture of 49% buffered hydrofluoric acid (4.5% HF+36% NH$_4$F+H$_2$O), an alcohol and a 30% aqueous solution of hydrogen peroxide (10:6: 50). Consequently, a selective etching was effected to remove only the porous Si regions in 205 minutes. It was thus possible to obtain a single crystal Si substrate having at least one hole wholly penetrating through the substrate from one to the other side. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

The same result was obtained when any one of the etchants used in the preceding examples was used in place of the mixture of 49% hydrofluoric acid, an alcohol and 30% aqueous solution of hydrogen peroxide.

Example 14

A 1 μm-thick polyimide film was formed by application on each major surface of a low-resistance single crystal Si of 200 μm thick in such a manner that at least one exposed Si region exists in each major surface of the substrate. The exposed Si regions on both surfaces were vertically aligned with each other. Thus, a mask was formed on each surface of the Si substrate for the purpose of forming non-porous Si regions by an anodization which is to be conducted subsequently.

The anodization was conducted in an HF solution. The conditions of the anodization were as follows:

Current density: 30 (mA·cm$^{-2}$)
Anodizing solution: HF: H$_2$O: C$_2$H$_5$=1:1:1
Time: 1.6 (hours)
Thickness of porous Si: 200 (μm)
Porosity: 56 (%)

Consequently, the regions which were not covered by the masks were changed into porous Si over the entire thickness from one to the other surfaces of the substrate.

Then, after the masks were removed, a single crystal Si layer of 0.5 μm thick, which functions as an etching stop layer and finally forms an unsupported membrane, was formed on either one surface of the substrate by MBE (molecular beam epitaxy). The growing conditions were as follows:

Temperature: 700° C.
Pressure: $1 \times 10^{-9}$ Torr
Growth rate: 0.1 nm/sec

The substrate was immersed in an agitated 49% hydrofluoric acid so that selective etching was effected to remove only the porous Si regions in 78 minutes. Consequently, holes reaching the single crystal Si layer was formed, whereby a single crystal Si substrate was obtained having at least one such a hole. The hole has wall surface perpendicular to the surfaces of the substrate. The configuration and the size of the hole could be determined solely by the mask pattern. It was also confirmed that any size of hole smaller than the size of the substrate can be obtained.

Finally, a membrane region having no underlying support was obtained on the surface of the Si substrate.

Example 15

Apiezon wax was applied as a mask on local portions of each major surface of a low-resistance single crystal Si of 200 $\mu$m thick in such a manner that at least one exposed Si region exists in each major surface of the substrate. The exposed Si regions on both surfaces were vertically aligned with each other. Thus, a mask was formed on each surface of the Si substrate for the purpose of forming non-porous Si regions by an anodization which is to be conducted subsequently.

The anodization was conducted in an HF solution. The conditions of the anodization were the same as those in Example 14.

Consequently, the regions which were not covered by the masks were changed into porous Si over the entire thickness from one to the other surfaces of the substrate.

Then, after the masks were removed, an $Si_3N_4$ layer of 0.5 $\mu$m thick, which functions as an etching stop layer and finally forms an unsupported membrane, was formed on either one surface of the substrate by liquid phase CVD (chemical vapor deposition). The conditions were as follows:

Gas: $SiH_2Cl_2+NH_3$
Temperature: 800° C.
Growth rate: 3 nm/sec

The substrate was immersed in a mixture of 49% hydrofluoric acid and an alcohol (10:1), so that selective etching was effected to remove only the porous Si regions in 82 minutes. Consequently, holes reaching the $Si_3N_4$ layer was formed, whereby a single crystal Si substrate was obtained having at least one such a hole. The hole had wall surface perpendicular to the surfaces of the substrate. The configuration and the size of the hole could be determined solely by the mask pattern. It was also confirmed that any size of hole smaller than the size of the substrate can be obtained.

Finally, a membrane region having no underlying support was obtained on the surface of the Si substrate.

Example 16

An amorphous Si layer serving as a mask was formed on each major surface of a low-resistance single crystal Si substrate of 200 $\mu$m thick by evaporation.

The conditions of evaporation were as follows:
Temperature: 200° C.
Pressure: $1\times10^{-9}$ Torr
Deposition rate: 0.1 nm/sec Then, a resist film of a predetermined pattern was formed on the amorphous Si layer by lithographic technique, and the regions where the amorphous Si layer was exposed was etched by RIE (reactive ion etching) method until the low-resistance single crystal Si appears. Thus, at least one exposed Si region was formed on each side of the substrate. The exposed Si regions on both sides of the substrate were aligned with each other. Consequently, a mask was formed on each side of the substrate for the purpose of forming non-porous Si regions in a subsequent anodization step.

The anodization was conducted in an HF solution. The conditions of the anodization were the same as those in Example 14.

Consequently, the regions which were not covered by the masks were changed into porous Si over the entire thickness from one to the other surfaces of the substrate.

Then, the amorphous Si layers were removed by etching conducted using hot phosphoric acid as the etchant, and an SiC layer of 0.5 $\mu$m thick, which functions as an etching stop layer and finally forms an unsupported membrane, was formed on either one surface of the substrate by CVD (chemical vapor deposition). The conditions were as follows:

Gas: $SiH_2Cl_2+CH_4$
Temperature: 1100° C.

The substrate was immersed in a mixture of 49% hydrofluoric acid and a 30% aqueous solution of hydrogen peroxide (1:5) and the mixture was agitated, so that selective etching was effected to remove only the porous Si regions in 62 minutes. Consequently, holes reaching the SiC layer was formed, whereby a single crystal Si substrate was obtained having at least one such a hole. The hole had wall surface perpendicular to the surfaces of the substrate. The configuration and the size of the hole could be determined solely by the mask pattern. It was also confirmed that any size of hole smaller than the size of the substrate can be obtained.

Finally, a membrane region having no underlying support was obtained on the surface of the Si substrate.

Example 17

A 1 $\mu$m-thick polyimide film was formed by application on each major surface of a low-resistance single crystal substrate Si of 200 $\mu$m thick in such a manner that at least one exposed Si region exists in each major surface of the substrate. The exposed Si regions on both surfaces were vertically aligned with each other. Thus, a mask was formed on each surface of the Si substrate for the purpose of forming non-porous Si regions by an anodization which is to be conducted subsequently.

The anodization was conducted in an HF solution. The conditions of the anodization were the same as those in Example 14.

Consequently, the regions which were not covered by the masks were changed into porous Si over the entire thickness from one to the other surfaces of the substrate.

Then, after the masks were removed, a single crystal Si layer of 1 $\mu$m thick, which functions as an etching stop layer and finally forms an unsupported membrane, was formed on either one surface of the substrate by reduced-pressure CVD (chemical vapor deposition). The conditions were as follows:

Source gas: $SiH_4$
Carrier gas: $H_2$
Temperature: 850° C.
Pressure: $1\times10^{-2}$ Torr
Growth time: 3.3 nm/sec The substrate was immersed in a mixture of 49% hydrofluoric acid, an alcohol and 30% aqueous solution of hydrogen peroxide (10:6:50), so that selective etching was effected to remove only the porous Si regions in 65 minutes. Consequently, holes reaching the single crystal Si layer was formed, whereby a single crystal Si substrate was obtained having at least one such a hole. The hole has wall surface perpendicular to the surfaces of the substrate. The configuration and the size of the hole could be determined solely by the mask pattern. It was also confirmed that any size of hole smaller than the size of the substrate can be obtained.

Finally, a membrane region having no underlying support was obtained on the surface of the Si substrate.

Example 18

A 1 μm-thick polyimide film was formed by application on each major surface of a low-resistance single crystal substrate Si of 200 μm thick in such a manner that at least one exposed Si region exists in each major surface of the substrate. The exposed Si regions on both surfaces were deviated from each other when viewed in plan. Thus, a mask was formed on each surface of the Si substrate for the purpose of forming non-porous Si regions by an anodization which is to be conducted subsequently.

The anodization was conducted in an HF solution. The conditions of the anodization were the same as those in Example 14.

Consequently, the regions which were not covered by the masks were changed into porous Si over the entire thickness from one to the other surfaces of the substrate.

Then, after the masks were removed, a single crystal Si layer of 1 μm thick, which functions as an etching stop layer and finally forms an unsupported membrane, was formed on either one surface of the substrate by plasma CVD (chemical vapor deposition). The conditions were as follows:

Source gas: $SiH_4$
RF power: 100W
Temperature: 800° C.
Pressure: $1 \times 10^{-2}$ Torr
Growth rate: 2.5 nm/sec The substrate was immersed in a mixture of 49% hydrofluoric acid, an alcohol and 30% aqueous solution of hydrogen peroxide (10:6:50), so that selective etching was effected to remove only the porous Si regions in 65 minutes. Consequently, holes reaching the single crystal Si layer was formed, whereby a single crystal Si substrate was obtained having at least one such a hole. The hole had wall surface inclined to the surfaces of the substrate at an angle corresponding to the amount of deviation of the mask windows between both sides of the substrate. The configuration and the size of the hole could be determined solely by the mask pattern. It was also confirmed that any size of hole smaller than the size of the substrate can be obtained.

Finally, a membrane region having no underlying support was obtained on the surface of the Si substrate.

Example 19

An N-type high-resistance epitaxial Si layer of 0.5 μm thick was formed on one major surface of a P-type low-resistance single crystal Si substrate of 200 μm thick by MBE (molecular beam epitaxy). The growing conditions were as follows:

Temperature: 700° C.
Pressure: $1 \times 10^{-9}$ Torr
Growth rate: 0.1 nm/sec

Then, a resist of a predetermined pattern was formed on the epitaxial Si layer by lithography, and an etching was conducted by RIE (reactive ion etching) method so as to etch the regions where the epitaxial Si layer is exposed until the low-resistance Si substrate appears. Consequently, at least one exposed low-resistance region was formed in each major surface of the substrate. Thus, a mask was formed for the purpose of forming porous Si regions in an anodization which is to be conducted subsequently.

The anodization was conducted in an HF solution. The conditions of the anodization were the same as those in Example 14.

Consequently, the regions which are not covered by the mask where changed into porous Si whole through the thickness of the substrate from one to the other side of the substrate.

Then, the N-type high-resistance Si regions serving as the mask were removed by the action of a mixture of ethylene diamine and pyrocatechol. Then, a single crystal Si film of 3 μm thick, which functions as an etching stop layer and which finally forms an unsupported membrane, was formed by liquid phase epitaxy on the surface from which the mask has been removed. This layer was formed under the following conditions:

Solvent: Sn
Growth temperature: 900° C.
Growth atmosphere: $H_2$
Growth time: 30 min The substrate was immersed in a mixture of 49% hydrofluoric acid, an alcohol and 30% aqueous solution of hydrogen peroxide (10:6:50), so that selective etching was effected to remove only the porous Si regions in 65 minutes. Consequently, holes reaching the single crystal Si layer was formed, whereby a single crystal Si substrate was obtained having at least one such a hole. The configuration and the size of the hole could be determined solely by the mask pattern. It was also confirmed that any size of hole smaller than the size of the substrate can be obtained.

The same result was obtained when any one of the etchants used in the preceding examples was used in place of the mixture of 49% hydrofluoric acid, an alcohol and 30% aqueous solution of hydrogen peroxide.

Finally, a membrane region having no underlying support was obtained on the surface of the Si substrate.

Example 20

A high-resistance epitaxial Si layer of 0.5 μm thick was formed on one major surface of a low-resistance single crystal Si substrate of 200 μm thick by reduced-pressure CVD (chemical vapor deposition). The growing conditions were as follows:

Source gas: $SiH_4$
Carrier gas: $H_2$
Temperature: 850° C.
Pressure: $1 \times 10^{-2}$ Torr
Growth rate: 3.3 nm/sec Then, a resist of a predetermined pattern was formed on the epitaxial Si layer by lithography, and an etching was conducted by RIE (reactive ion etching) method so as to etch the regions where the epitaxial Si layer is exposed until the low-resistance Si substrate appears. Consequently, at least one exposed low-resistance region was formed in each major surface of the substrate. Thus, a mask was formed for the purpose of forming porous Si regions in an anodization which is to be conducted subsequently.

The anodization was conducted in an HF solution. The conditions of the anodization were the same as those in Example 14.

Consequently, the regions which are not covered by the mask where changed into porous Si whole through the thickness of the substrate from one to the other side of the substrate.

Then, an $Si_3N_4$ film of 0.5 μm thick, which functions as an etching stop layer and which finally forms an unsupported membrane, was formed on the surface of the substrate opposite to the mask. This layer was formed under the following conditions:

Gas: $SiH_2Cl_2+NH_3$

Temperature: 800° C.

Forming rate: 3 nm/min

The substrate was immersed in a mixture of 49% hydrofluoric acid, an alcohol and 30% aqueous solution of hydrogen peroxide (10:6:50), so that selective etching was effected to remove only the porous Si regions in 65 minutes. Consequently, holes reaching the $Si_3N_4$ film was formed, whereby a single crystal Si substrate was obtained having at least one such a hole. The configuration and the size of the hole could be determined solely by the mask pattern. It was also confirmed that any size of hole smaller than the size of the substrate can be obtained.

The same result was obtained when any one of the etchants used in the preceding examples was used in place of the mixture of 49% hydrofluoric acid, an alcohol and 30 % aqueous solution of hydrogen peroxide.

Finally, a membrane region having no underlying support was obtained on the surface of the Si substrate.

Example 21

Each major surface of a 200 μm-thick P-type low-resistance single crystal Si substrate (B concentration: $1 \times 10^{19}$ cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: $P^+$

Energy: 120 KeV

Implantation rate: $2 \times 10^{14}$ cm$^{-2}$

Heat treatment: 900° C., 30 min

Consequently, at least one low-resistance region where ions were not injected was formed in each surface of the single crystal Si substrate. The low-resistance regions on both surfaces were aligned with each other. Thus, a mask was formed on each surface of the Si substrate for the purpose of forming non-porous Si regions by an anodization which is to be conducted subsequently.

The anodization was conducted in an HF solution. The conditions of the anodization were the same as those in Example 14.

Consequently, the regions where ions were not injected were changed into porous Si over the entire thickness from one to the other surfaces of the substrate. Then, a single crystal Si film of 0.5 μm thick, which serves as an etching stop layer and which finally forms an unsupported membrane, was formed on either one surface of the substrate by MBE method. The forming conditions were as follows:

Temperature: 700° C.

Pressure: $1 \times 10^{-9}$ Torr

Growth rate: 0.1 nm/sec

The substrate was then immersed in a bath of 49% buffered hydrofluoric acid (4.5% HF+36% $NH_4F+H_2O$) the bath was agitated. Consequently, a selective etching was effected to remove only the porous Si regions in 258 minutes to form a hole which reaches the single crystal Si. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

Finally, an unsupported membrane region having no underlying support was formed on the surface of the Si substrate.

Example 22

Each major surface of a 200 μm-thick P-type low-resistance single crystal Si substrate (B concentration: $2 \times 10^{17}$ cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: $H^+$

Energy: 100 KeV

Implantation rate: $2 \times 10^{14}$ cm$^{-2}$

Heat treatment; 500° C., 30 min

Consequently, at least one low-resistance region where ions were not injected was formed in each surface of the single crystal Si substrate. The low-resistance regions on both surfaces were aligned with each other. Thus, a mask was formed on each surface of the Si substrate for the purpose of forming non-porous Si regions by an anodization which is to be conducted subsequently.

The anodization was conducted in an HF solution. The conditions of the anodization were the same as those in Example 14.

Consequently, the regions where ions were not injected were changed into porous Si over the entire thickness from one to the other surfaces of the substrate.

Then, an $Si_3N_4$ film of 0.5 μm thick, which serves as an etching stop layer and which finally forms an unsupported membrane, was formed on either one surface of the substrate by liquid phase CVD (chemical vapor deposition) method. The conditions for forming this film was as follows:

Gas: $SiH_2Cl_2+NH_3$

Temperature: 800° C.

Growth rate: 3 nm/min

The substrate was then immersed in a mixture of 49% buffered hydrofluoric acid (4.5% HF+36% $NH_4F+H_2O$) and an alcohol (10:1). Consequently, a selective etching was effected to remove only the porous Si regions in 275 minutes thus forming holes reaching the $Si_3N_4$ film. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

Finally, an unsupported membrane region having no underlying support was formed on the surface of the Si substrate.

Example 23

Each major surface of a 200 µm-thick N-type low-resistance single crystal Si substrate (B concentration: $1 \times 10^{19}$ cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: B$^+$
Energy: 150 KeV
Implantation rate: $4 \times 10^{14}$ cm$^{-2}$
Heat treatment: 900° C., 30 min Consequently, at least one exposed Si region was formed in each surface of the single crystal Si substrate. The exposed Si regions on both surfaces were aligned with each other. Thus, a mask was formed on each surface of the Si substrate for the purpose of forming non-porous Si regions by an anodization which is to be conducted subsequently.

The anodization was conducted in an HF solution. The conditions of the anodization were the same as those in Example 14.

Consequently, the regions where ions were not injected were changed into porous Si over the entire thickness from one to the other surfaces of the substrate. Then, an SiC layer of 0.5 µm thick, which serves as an etching stop layer and which finally forms unsupported membrane, was formed on either one side of the substrate by CVD (chemical vapor deposition). The forming conditions were as follows:

Gas: SiH$_4$+CH$_4$
Temperature: 1100° C.

The substrate was then immersed in a mixture of 49% buffered hydrofluoric acid (4.5% HF+36% NH$_4$F+H$_2$O) and a 30% aqueous solution of hydrogen peroxide (1:5) and the mixture was agitated. Consequently, a selective etching was effected to remove only the porous Si regions to form holes reaching the SiC film in 191 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

Finally, an unsupported membrane region having no underlying support was formed on the surface of the Si substrate.

Example 24

Each major surface of a 200 µm-thick P-type low-resistance single crystal Si substrate (B concentration: $1 \times 10^{19}$ cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: P$^+$
Energy: 120 KeV
Implantation rate: $2 \times 10^{14}$ cm$^{-2}$
Heat treatment: 900° C., 30 min Consequently, at least one low-resistance region where ions were not injected was formed in each surface of the single crystal Si substrate. The exposed Si regions on both surfaces were aligned with each other. Thus, a mask was formed on each surface of the Si substrate for the purpose of forming non-porous Si regions by an anodization which is to be conducted subsequently.

The anodization was conducted in an HF solution. The conditions of the anodization were the same as those in Example 14.

Consequently, the regions where ions were not injected were changed into porous Si over the entire thickness from one to the other surfaces of the substrate.

Then, a single crystal Si film of 1 µm thick, which serves as an etching stop layer and which finally forms an unsupported membrane, was formed on either one surface of the substrate by bias-sputtering method. The forming conditions were as follows:

RF frequency: 100 MHz
RF power 600W
Ar gas pressure: 8 10$^{-3}$ Torr
D.C. bias: –200V
Substrate D.C. bias: +5V
Temperature: 300° C.
Growth time: 120 min The substrate was then immersed in a mixture of 49% buffered hydrofluoric acid (4.5% HF+36% NH$_4$F+H$_2$O), an alcohol and a 30% aqueous solution of hydrogen peroxide (10:6:50). Consequently, a selective etching was effected to remove only the porous Si regions to form holes reaching the single crystal Si in 205 minutes. It was thus possible to obtain a single crystal Si substrate having at least one hole wholly penetrating through the substrate from one to the other side. The hole had a wall surface which is perpendicular to the surfaces of the substrate. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

Finally, an unsupported membrane region having no underlying support was formed on the surface of he Si substrate.

Example 25

Each major surface of a 200 µm-thick P-type low-resistance single crystal Si substrate (B concentration: $1 \times 10^{19}$ cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: P$^+$
Energy: 120 KeV
Implantation rate: $2 \times 10^{14}$ cm$^{-2}$
Heat treatment: 900° C., 30 min Consequently, at least one low-resistance region where ions were not injected was formed in each surface of the single crystal Si substrate. The exposed Si regions on both surfaces were deviated from each other when viewed in plan. Thus, a mask was formed on each surface of the Si substrate for the purpose of forming non-porous Si regions by an anodization which is to be conducted subsequently.

The anodization was conducted in an HF solution. The conditions of the anodization were thee same as those in Example 14.

Consequently, the regions where ions were not injected were changed into porous Si over the entire thickness from one to the other surfaces of the substrate.

Then, a single crystal layer of 1 $\mu$m thick, which serves as an etching stop layer and which finally forms an unsupported membrane, was formed on either one side of the substrate by bias sputtering method. The conditions were as follows:

RF frequency: 100 MHz
RF power: 600 W
Ar gas pressure: $8\times10^{-3}$ Torr
D.C. Bias: −200 V
Substrate D.C. bias: +5 V
Temperature: 300° C.
Growth time: 120 min The substrate was then immersed in a mixture of 49% buffered hydrofluoric acid (4.5% HF+36% $NH_4F+H_2O$), an alcohol and a 30% aqueous solution of hydrogen peroxide (10:6:50). Consequently, a selective etching was effected to remove only the porous Si regions to form a hole reaching the single crystal Si film in 205 minutes. It was thus possible to obtain a single crystal Si substrate having at least one hole wholly penetrating through the substrate from one to the other side. The hole had a wall surface which is inclined to the surfaces of the substrate at an angle corresponding to the amount of deviation of the mask windows between both sides of the substrate. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

Finally, an unsupported membrane region having no underlying support was formed on the surface of the Si substrate.

Example 26

One major surface of a 200 $\mu$m-thick P-type low-resistance single crystal Si substrate (B concentration: $1\times10^{19}$ cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: P$^+$
Energy: 120 KeV
Implantation rate: $2\times10^{14}$ cm$^{-2}$
Heat treatment: 900 C., 30 min Consequently, at least one low-resistance region where ions were not injected was formed in each surface of the single crystal Si substrate. Thus, a mask was formed on each surface of the Si substrate for the purpose of forming non-porous Si regions by an anodization which is to be conducted subsequently.

The anodization was conducted in an HF solution. The conditions of the anodization were the same as those in Example 14.

Consequently, the regions where ions were not injected were changed into porous Si over the entire thickness from one to the other surfaces of the substrate. Then, a single crystal Si film of 1 $\mu$m thick, which functions as an etching stop layer and which finally forms an unsupported membrane, was formed by MBE method. The forming conditions were as follows:

Temperature: 700° C.
Pressure: $1\times10^{-9}$ Torr
Growth rate: 0.1 nm/sec

The substrate was then immersed in a mixture of 49% buffered hydrofluoric acid (4.5% HF+36% $NH_4F+H_2O$), an alcohol and a 30% aqueous solution of hydrogen peroxide (10: 6: 50). Consequently, a selective etching was effected to remove only the porous Si regions to form holes reaching the single crystal Si film in 205 minutes. It was thus possible to obtain a single crystal Si substrate having at least one hole wholly penetrating through the substrate from one to the other side. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

The same result was obtained when any one of three etchants used in the preceding examples was used in place of the mixture of 49% hydrofluoric acid, an alcohol and 30% aqueous solution of hydrogen peroxide.

Finally, an unsupported membrane region having no underlying support was formed on the surface of the Si substrate.

Example 27

One major surface of a 200 $\mu$m-thick P-type low-resistance single crystal Si substrate (B concentration: $1\times10^{19}$ Cm$^{-3}$) was masked by a resist and the portions of the Si substrate exposed through windows formed in the mask were changed into high-resistance regions by ion implantation and a subsequent heat treatment. The conditions of ion implantation and heat treatment were as follows:

Ion seed: P$^+$
Energy: 120 KeV
Implantation rate: $2\times10^{14}$ cm$^{-2}$
Heat treatment: 900° C., 30 min Consequently, at least one low-resistance region where ions were not injected was formed in each surface of the single crystal Si substrate. Thus, a mask was formed on each surface of the Si substrate for the purpose of forming non-porous Si regions by an anodization which is to be conducted subsequently.

The anodization was conducted in an HF solution. The conditions of the anodization were as follows:

Current density: 15 (mA·cm$^{-2}$)
Anodizing solution: HF: $H_2O$: $C_2H_5OH$ =1:1:1
Time: 2.6 (hours)
Thickness of porous Si: 200 ($\mu$m)
Porosity 56 (%)

Consequently, the regions where ions were not injected were changed into porous Si over the entire thickness from one to the other surfaces of the substrate. Then, an $Si_3N_4$ film of 0.5 $\mu$m thick, which functions as an etching stop layer and which finally forms an unsupported membrane, was formed by liquid phase CVD (chemical vapor deposition) on the surface of the substrate opposite to the surface through which ions were injected. The forming conditions were as follows:

Gas: $SiH_2Cl_2+NH_3$

Temperature: 800° C.

Growth rate: 3 nm/min

The substrate was then immersed in a mixture of 49% buffered hydrofluoric acid (4.5% HF+36% $NH_4F+H_2O$), an alcohol and a 30% aqueous solution of hydrogen peroxide (10: 6: 50). Consequently, a selective etching was effected to remove only the porous Si regions to form holes reaching the $Si_3N_4$ film in 205 minutes. It was thus possible to obtain a single crystal Si substrate having at least one hole wholly penetrating through the substrate from one to the other side. The configuration and the size of the hole could be determined by the pattern of the resist employed in the ion implantation. The sole limitation was that the hole size must be smaller than the size of the substrate.

Although the high-resistance regions were formed by ion implantation, the same result as that obtained by the described example was obtained by using diffusion instead of the ion implantation.

The same result was obtained when any one of three etchants used in the preceding examples was used in place of the mixture of 49% hydrofluoric acid, an alcohol and 30% aqueous solution of hydrogen peroxide.

Finally, an unsupported membrane region having no underlying support was formed on the surface of the Si substrate.

Example 28

Apiezon wax was applied as a mask on local portions of each major surface of a low-resistance single crystal Si of 200 μm thick in such a manner that at least one exposed Si region exists in each major surface of the substrate. The exposed Si regions on both surfaces were vertically aligned with each other. Thus, a mask was formed on each surface of the Si substrate for the purpose of forming non-porous Si regions by an anodization which is to be conducted subsequently.

The anodization was conducted in an HF solution. The conditions of the anodization were the same as those in Example 14.

Consequently, the regions which were not covered by the masks were changed into porous Si over the entire thickness from one to the other surfaces of the substrate.

Then, after the masks were removed, an $Si_3N_4$ layer of 0.1 μm thick, an $SiO_2$ film of 1 μm thick and an $Si_3N_4$ layer of 0.1 μm thick, which form a laminate layer which functions as an etching stop layer and finally forms an unsupported membrane, were formed in the mentioned order on either one surface of the substrate by liquid phase CVD (chemical vapor deposition). The conditions were as follows:

($Si_3N_4$ film)

Gas: $SiH_2Cl_2+NH_3$

Temperature: 800° C.

Growth rate: 3 nm/sec ($SiO_2$ film)

Gas: $N_2$-diluted 1% $SiH_4$ 45 SCCM $O_2$ 60 SCCM $N_2$ 50 SCCM

The substrate was immersed in a mixture of buffered hydrofluoric acid (4.5% HF+36% $NH_4F+H_2O$) and an alcohol (10:1), so that selective etching was effected to remove only the porous Si regions to form holes reaching the $Si_3N_4$ film in 82 minutes. Consequently, holes reaching the $Si_3N_4$ layer was formed, whereby a single crystal Si substrate was obtained having at least one such a hole. The hole had wall surface perpendicular to the surfaces of the substrate. The configuration and the size of the hole could be determined solely by the mask pattern. The sole limitation was that the size of the hole must be smaller than the size of the substrate.

Finally, a membrane region having no underlying support was obtained on the surface of the Si substrate.

Example 29

A high-resistance epitaxial Si layer of 0.5 μm thick was formed on each major surface of a low-resistance single crystal Si substrate of 200 μm thick by reduced-pressure CVD (chemical vapor deposition). The growing conditions were as follows:

Source gas: $SiH_4$

Carrier gas: $H_2$

Temperature: 850° C.

Pressure: $1\times10^{-2}$ Torr

Growth rate: 3.3 nm/sec

Then, a resist of a predetermined pattern was formed on the epitaxial Si layer by lithography, and an etching was conducted by RIE (reactive ion etching) method so as to etch the regions where the epitaxial Si layer is exposed until the low-resistance Si substrate appears. Consequently, at least one exposed low-resistance region was formed in each major surface of the substrate. The exposed low-resistance regions on both surfaces of the substrate were aligned with each other. Thus, a mask was formed for the purpose of forming porous Si regions in an anodization which is to be conducted subsequently.

The anodization was conducted in an HF solution. The conditions of the anodization were as follows:

Current density: 30 (mA·cm$^{-2}$)

Anodizing solution: HF: $H_2O$: $C_2H_5OH$=1:1:1

Time: 1.6 (hours)

Thickness of porous Si: 200 (μm)

Porosity: 56 (%)

Consequently, the regions which are not covered by the mask where changed into porous Si whole through the thickness of the substrate from one to the other side of the substrate.

Figure 21:
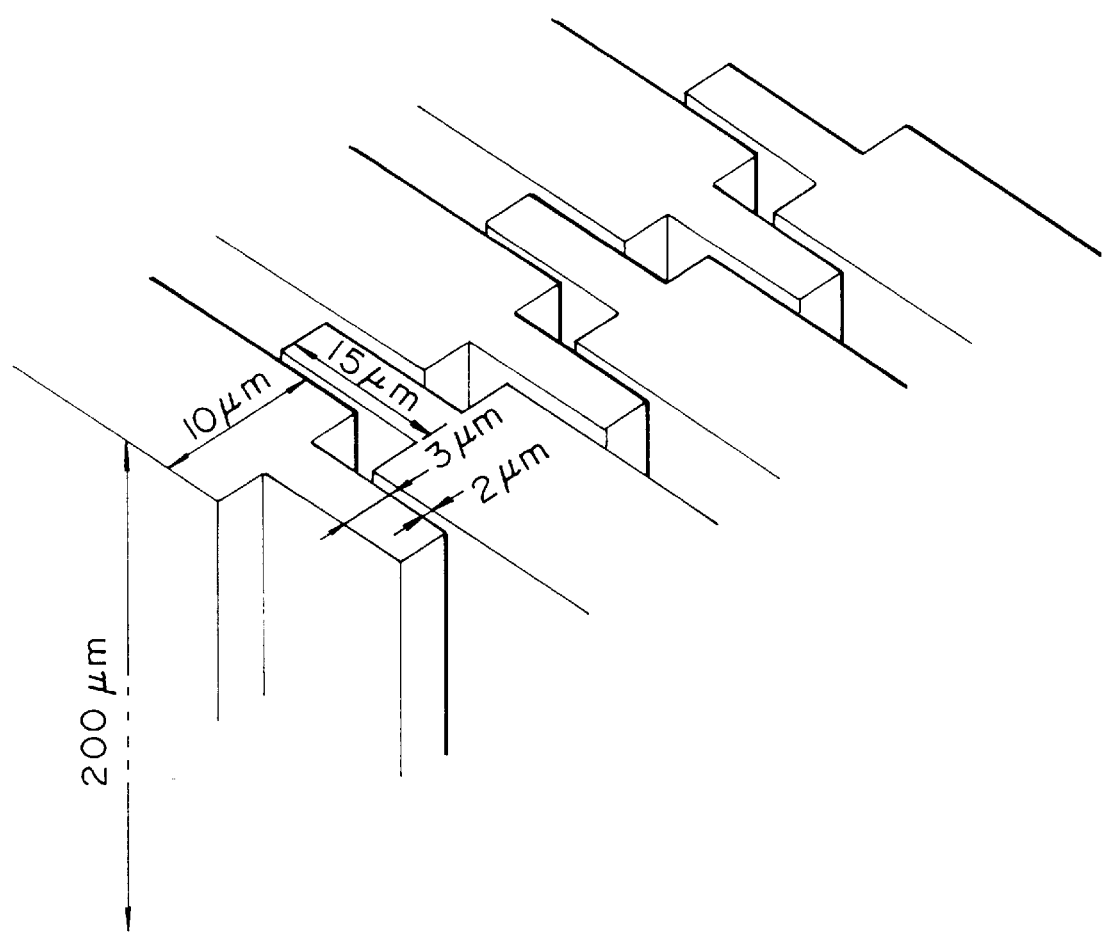
FIG. 21 is a schematic illustration of an Si product produced by a method of the present invention.

The substrate was immersed in 49% hydrofluoric acid. Consequently, a selective etching was effected to remove only the porous Si regions, thus forming holes penetrating to the reverse side of the substrate. The configurations of the holes thus formed were as shown in FIG. 21.

The Si product obtained through the described process could be satisfactorily used as an electrode of an electrostatic actuator. It was also confirmed that the Si product is applicable to micro-machining. The same results were obtained when the described etchant was substituted by any one of other etchants used in other examples.

Although the invention has been described through its preferred forms, it is to be understood that the described embodiments and examples are only illustrative and various changes and modifications may be imparted thereto without departing from the scope of the present invention which is limited solely by the appended claims.

What is claimed is:

1. A method of processing a Si substrate comprising the steps of:

(a) preparing a non-porous Si substrate having a front side and a back side;

(b) changing a portion of said non-porous Si substrate, extending through said non-porous Si substrate from said front side to said back side, into porous Si and;

(c) selectively etching said substrate employing an aqueous hydrofluoric acid etchant containing at least one of hydrogen peroxide or alcohol, to remove said porous Si region and form a hole in said non-porous Si substrate.

2. A method according to claim 1, wherein said etchant used in step (c) is buffered hydrofluoric acid.

3. A method of processing a Si substrate comprising the steps of:

(a) preparing a non-porous Si substrate having a front side and a back side and having an etching stop layer formed on said front side or said back side thereof;

(b) forming a porous Si region extending through said non-porous Si substrate from said front side to said back side to said etching stop layer; and (c) selectively etching said substrate employing an aqueous hydrofluoric acid etchant containing at least on of hydrogen peroxide or alcohol, to remove said porous Si region and to form a hole in said non-porous Si substrate.

4. A method according to claim 3, wherein said etching stop layer has a high-etching-resistance.

* * * * *

UNITED STATES PATENT AND TRADEMARK OFFICE
CERTIFICATE OF CORRECTION

PATENT NO. : 5,868,947

DATED : February 9, 1999

INVENTOR(S) : KIYOFUMI SAKAGUCHI ET AL.

It is certified that error appears in the above-identified patent and that said Letters Patent is hereby corrected as shown below:

COLUMN 1

Line 30, "lot" should read --not--.

COLUMN 2

Line 20, "than" should read --as--.

COLUMN 3

Line 22, "employs," should read --employs--.

COLUMN 4

Line 59, "perforate perforate" should read --perforate--.

COLUMN 5

Line 19, "extend" should read --extends--.
Lien 37, "produce" should read --produced due to--.

UNITED STATES PATENT AND TRADEMARK OFFICE
CERTIFICATE OF CORRECTION

PATENT NO.  : 5,868,947

DATED       : February 9, 1999

INVENTOR(S) : KIYOFUMI SAKAGUCHI ET AL.                    Page 2 of 7

It is certified that error appears in the above-identified patent and that said Letters Patent is hereby corrected as shown below:

COLUMN 12

Line 16, "impath" should read --impair--.

COLUMN 13

Line 64, "shows" should read --show--.

COLUMN 15

Line 65, "high-resistance" should read
      --high-resistance regions--.

COLUMN 19

Line 67, "follows." should read --follows:--.

COLUMN 26

Line 38, "thick" should read --thickness--.

UNITED STATES PATENT AND TRADEMARK OFFICE
CERTIFICATE OF CORRECTION

PATENT NO. : 5,868,947

DATED : February 9, 1999

INVENTOR(S) : KIYOFUMI SAKAGUCHI ET AL.

It is certified that error appears in the above-identified patent and that said Letters Patent is hereby corrected as shown below:

COLUMN 27

Line 4, "a" should be deleted.
Line 30, "thick," should read --thickness,--.
Line 41, "was" should read --were--.
Line 43, "a" should be deleted.
Line 63, "exposed was" should read --exposed were--.

COLUMN 28

Line 14, "either one surface" should read --either surface--.
Line 25, "a" should be deleted.
Line 53, "either one surface" should read --either surface--.
Line 66, "was" should read --were--.

UNITED STATES PATENT AND TRADEMARK OFFICE
CERTIFICATE OF CORRECTION

PATENT NO. : 5,868,947

DATED : February 9, 1999

INVENTOR(S) : KIYOFUMI SAKAGUCHI ET AL.

It is certified that error appears in the above-identified patent and that said Letters Patent is hereby corrected as shown below:

COLUMN 29

Line 1, "a" should be deleted.
    Line 26, "thick," should read --thickness,--.
    Line 28, "either one surface" should read --either surface--.
    Line 41, "was" should read --were--.
    Line 43, "a" should be deleted.
    Line 55, "thick" should read --thickness--.

COLUMN 30

Line 8, "where" should read --were--; and "whole" should read --wholly--.
    Line 14, "thick," should read --thickness,--.
    Line 19, "Solvent: Sn" should be deleted.
    Line 27, "was" should read --were--.
    Line 29, "a" should be deleted.
    Line 43, "thick" should read --thickness--.

UNITED STATES PATENT AND TRADEMARK OFFICE
CERTIFICATE OF CORRECTION

PATENT NO. : 5,868,947

DATED : February 9, 1999

INVENTOR(S) : KIYOFUMI SAKAGUCHI ET AL.

It is certified that error appears in the above-identified patent and that said Letters Patent is hereby corrected as shown below:

COLUMN 31

Line 1, "thick," should read --thickness,--.
  Line 13, "was" should read --were--.
  Line 15, "a" should be deleted.
  Line 52, "thick," should read --thickness,--.
  Line 54, "either one surface" should read --either surface--.

COLUMN 32

Line 39, "thick," should read --thickness,--.

COLUMN 33

Line 26, "thick," should read --thickness,--.

COLUMN 34

Line 16, "either one surface" should read --either surface--.
  Line 21, "8 $10^{-3}$" should read --$8 \times 10^{-3}$--.
  Line 45, "he" should read --the--.

UNITED STATES PATENT AND TRADEMARK OFFICE
CERTIFICATE OF CORRECTION

PATENT NO. : 5,868,947

DATED : February 9, 1999

INVENTOR(S) : KIYOFUMI SAKAGUCHI ET AL.

It is certified that error appears in the above-identified patent and that said Letters Patent is hereby corrected as shown below:

COLUMN 35

Line 7, "thick," should read --thickness,--.
Line 9, "either one side" should read --either surface--.

COLUMN 36

Line 36, "Cm$^{-3}$)" should read --cm$^{-3}$)--.
Line 62, "thick," should read --thickness,--.

COLUMN 38

Line 1, "a" should be deleted.
Line 11, "thick" should read --thickness--.
Line 39, "where" should read --were--; and "whole" should read --wholly--.

UNITED STATES PATENT AND TRADEMARK OFFICE
CERTIFICATE OF CORRECTION

PATENT NO.   :  5,868,947

DATED        :  February 9, 1999

INVENTOR(S) :  KIYOFUMI SAKAGUCHI ET AL.

It is certified that error appears in the above-identified patent and that said Letters Patent is hereby corrected as shown below:

COLUMN 40

Line 4, "on" should read --one--.

Signed and Sealed this

Fourteenth Day of March, 2000

Attest:

Q. TODD DICKINSON

Attesting Officer                    Commissioner of Patents and Trademarks